(12) United States Patent
Hsu et al.

(10) Patent No.: US 7,431,866 B2
(45) Date of Patent: Oct. 7, 2008

(54) WATER DISPERSIBLE POLYTHIOPHENES MADE WITH POLYMERIC ACID COLLOIDS

(75) Inventors: Che-Hsiung Hsu, Wilmington, DE (US); Yong Cao, Goleta, CA (US); Sunghan Kim, Goleta, CA (US); Daniel David Lecloux, Buellton, CA (US); Chi Zhang, Goleta, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 74 days.

(21) Appl. No.: 10/669,494

(22) Filed: Sep. 24, 2003

(65) Prior Publication Data

US 2004/0102577 A1   May 27, 2004

Related U.S. Application Data

(60) Provisional application No. 60/464,369, filed on Apr. 22, 2003, provisional application No. 60/413,202, filed on Sep. 24, 2002.

(51) Int. Cl.
    *H01B 1/12*   (2006.01)
(52) U.S. Cl. ..................................... 252/500
(58) Field of Classification Search ............... 252/500; 549/5; 528/378
    See application file for complete search history.

(56) References Cited

U.S. PATENT DOCUMENTS

| | | | |
|---|---|---|---|
| 4,552,927 A | 11/1985 | Warren | |
| 4,869,979 A * | 9/1989 | Ohtani et al. | ............... 429/213 |
| 4,889,659 A | 12/1989 | Genies | |
| 4,959,430 A | 9/1990 | Jonas et al. | |
| 5,247,190 A | 9/1993 | Friend et al. | |
| 5,286,413 A | 2/1994 | Hannecart et al. | |
| 5,300,575 A | 4/1994 | Jonas et al. | |
| 5,317,169 A | 5/1994 | Nakano et al. | |
| 5,378,402 A | 1/1995 | Cross et al. | |
| 5,705,888 A | 1/1998 | Staring et al. | |
| 5,766,515 A | 6/1998 | Jonas et al. | ................. 252/500 |
| 5,986,400 A | 11/1999 | Staring et al. | |
| 5,994,496 A | 11/1999 | Van Haare et al. | |
| 6,083,635 A | 7/2000 | Jonas et al. | |

(Continued)

FOREIGN PATENT DOCUMENTS

EP   0 593 111 A1   4/1994

(Continued)

OTHER PUBLICATIONS

Pickup, Peter G. et al., Electronically conducting cation-exchange polymer powders: synthesis, characterization and applications in PEM fuel cells and supercapacitors, Journal of New Materials for Electrochemical Systems, 2000, 21-26, 3.

(Continued)

*Primary Examiner*—Mark Kopec

(57) ABSTRACT

Compositions are provided comprising aqueous dispersions of polythiophenes and colloid-forming polymeric acids. Films from invention compositions are useful as buffer layers in organic electronic devices, including electroluminescent devices, such as, for example, organic light emitting diodes (OLED) displays in combination with metal nanowires or carbon nanotubes in applications such as drain, source, or gate electrodes in thin film field effect transistors.

8 Claims, 14 Drawing Sheets

U.S. PATENT DOCUMENTS

| | | |
|---|---|---|
| 6,340,496 B1 | 1/2002 | Cloots et al. |
| 6,391,481 B1 | 5/2002 | Jonas et al. |
| 2004/0010115 A1* | 1/2004 | Sotzing .................... 528/377 |
| 2004/0072987 A1* | 4/2004 | Groenendaal et al. ....... 528/377 |

FOREIGN PATENT DOCUMENTS

| | | |
|---|---|---|
| EP | 0 440 957 B1 | 3/1996 |
| GB | 2 124 635 A | 2/1984 |
| JP | 2-160823 | 6/1990 |

OTHER PUBLICATIONS

Lefebvre, Mark et al., Chemical Synthesis, Characterization, and Electrochemical Studies of Poly(3,4-ethylenedioxythiophene)/Poly-(styrene-4-sulfonate) Composites, Chem. Mater., 1999, 262-268, 11, American Chemical Society.

Qi, Zhigang et al., Size Control of Polypyrrole Particles, Chem. Mater., 1997, 2394-2939, 9, American Chemical Society.

A. J. Sharpe, Jr. et al., Improved Cationic Conductive Polymer, Calgon Corp., Pittsburgh, PA, Coating Conference [Proceedings], pp. 83-87, 1981, ISSN 0364-2771.

* cited by examiner

WATER DISPERSIBLE POLYTHIOPHENES MADE WITH POLYMERIC ACID COLLOIDS

FIELD OF THE INVENTION

The invention relates to aqueous dispersions of electrically conducting polymers of thiophene, wherein the electrically conducting polymer is synthesized in the presence of polymeric acid colloids.

BACKGROUND OF THE INVENTION

Electrically conducting polymers have been used in a variety of organic electronic devices, including in the development of electroluminescent (EL) devices for use in light emissive displays. With respect to EL devices, such as organic light emitting diodes (OLEDs) containing conducting polymers, such devices generally have the following configuration:

anode/buffer layer/EL polymer/cathode

The anode is typically any material that has the ability to inject holes into the otherwise filled π-band of the semiconducting, EL polymer, such as, for example, indium/tin oxide (ITO). The anode is optionally supported on a glass or plastic substrate. The EL polymer is typically a conjugated semiconducting polymer such as poly(paraphenylenevinylene) or polyfluorene. The cathode is typically any material (such as, e.g., Ca or Ba) that has the ability to inject electrons into the otherwise empty π*-band of the semiconducting, EL polymer.

The buffer layer is typically a conducting polymer and facilitates the injection of holes from the anode into the EL polymer layer. The buffer layer can also be called a hole-injection layer, a hole transport layer, or may be characterized as part of a bilayer anode. Typical conducting polymers employed as buffer layers include polyaniline and polydioxythiophenes such as poly(3,4-ethylenedioxythiophene) (PEDT). These materials can be prepared by polymerizing aniline or dioxythiophene monomers in aqueous solution in the presence of a water soluble polymeric acid, such as poly (styrenesulfonic acid) (PSS), as described in, for example, U.S. Pat. No. 5,300,575 entitled "Polythiophene dispersions, their production and their use." A well known PEDT/PSS material is Baytron®-P, commercially available from H. C. Starck, GmbH (Leverkusen, Germany).

The aqueous electrically conductive polymer dispersions synthesized with water soluble polymeric sulfonic acids have undesirable low pH levels. The low pH can contribute to decreased stress life of an EL device containing such a buffer layer, and contribute to corrosion within the device. Accordingly, there is a need for compositions and buffer layers prepared therefrom having improved properties.

Electrically conducting polymers also have utility as electrodes for electronic devices, such as thin film field effect transistors. In such transistors, an organic semiconducting film is present between source and drain electrodes. To be useful for the electrode application, the conducting polymers and the liquids for dispersing or dissolving the conducting polymers have to be compatible with the semiconducting polymers and the solvents for the semiconducting polymers to avoid re-dissolution of either conducting polymers or semi-conducting polymers. The electrical conductivity of the electrodes fabricated from the conducting polymers should be greater than 10 S/cm (where S is a reciprocal ohm). However, the electrically conducting polythiophenes made with a polymeric acid typically provide conductivity in the range of $\sim 10^{-3}$ S/cm or lower. In order to enhance conductivity, conductive additives may be added to the polymer. However, the presence of such additives can deleteriously affect the processability of the electrically conducting polythiophene. Accordingly, there is a need for improved conductive polythiophenes with good processability and increased conductivity.

SUMMARY OF THE INVENTION

Compositions are provided comprising aqueous dispersions of polythiophenes and at least one colloid-forming polymeric acid. The invention compositions are useful as buffer layers in a variety of organic electronic devices, such as for example, organic light emitting diodes (OLEDs) and in combination with conductive fillers, such as metal nanowires or carbon nanotubes, in applications such as drain, source, or gate electrodes in thin film field effect transistors.

In accordance with another embodiment of the invention, there are provided organic electronic devices, including electroluminescent devices, comprising buffer layers of the invention compositions that are cast.

In accordance with still another embodiment of the invention, there are provided methods for synthesizing aqueous dispersions of polythiophenes and at least one colloid-forming polymeric acid. A method of producing an aqueous dispersion of polythiophene and at least one colloid-forming polymeric acid, comprising:

(a) providing a homogeneous aqueous mixture of water and thiophene;

(b) providing an aqueous dispersion of the colloid-forming polymeric acid;

(c) combining the thiophene mixture with the aqueous dispersion of the colloid-forming polymeric acid, and (d) combining a oxidizer and a catalyst, in any order, with the aqueous dispersion of the colloid-forming polymeric acid before or after the combining of step (c).

Other embodiments are described in the detailed description of this invention.

DETAILED DESCRIPTION OF THE INVENTION

Figure 1:
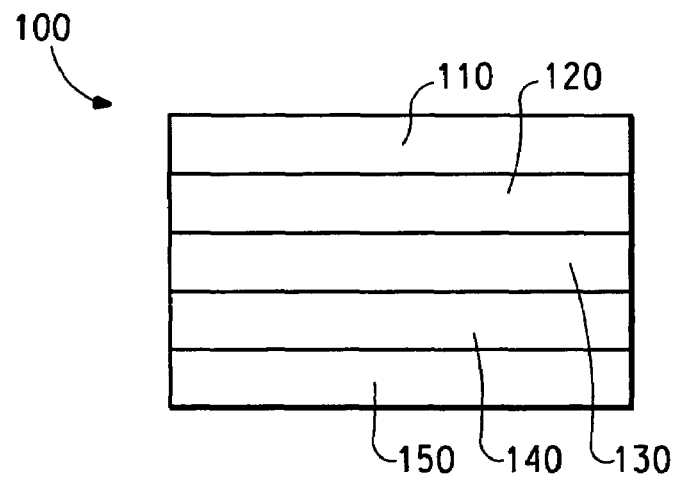
FIG. 1 illustrates a cross-sectional view of an electronic device that includes a buffer layer according to the invention.

In one embodiment of the invention, compositions are provided comprising aqueous dispersions of polythiophenes, including, polydioxythiophenes, and colloid-forming polymeric acids. As used herein, the term "dispersion" refers to a continuous liquid medium containing a suspension of minute particles. In accordance with the invention, the "continuous medium" is typically an aqueous liquid, e.g., water. As used herein, the term "aqueous" refers to a liquid that has a significant portion of water and in one embodiment it is at least about 40% by weight water. As used herein, the term "colloid" refers to the minute particles suspended in the continuous medium, said particles having a nanometer-scale particle size. As used herein, the term "colloid-forming" refers to substances that form minute particles when dispersed in aqueous solution, i.e., "colloid-forming" polymeric acids are not water-soluble.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

It has been discovered that aqueous dispersions of electrically conductive polythiophene and, specifically, poly(dioxythiophenes) can be prepared when thiophene monomers including dioxythiophene monomers, are polymerized chemically in the presence of colloid-forming polymeric acids. Further, it has been discovered that use of a polymeric acid that is not water soluble in preparation of an aqueous dispersion of the polythiophenes or poly(dioxythiophenes) yields a composition with superior electrical properties. One advantage of these aqueous dispersions is that the electrically conductive minute particles are stable in the aqueous medium without forming a separate phase over a long period of time before a use. Moreover, they generally do not re-disperse once dried into films.

Compositions according to one embodiment the invention contain a continuous aqueous phase in which the polydioxythiophene and colloid-forming polymeric acid are dispersed. Polydioxythiophenes contemplated for use in the practice of the present invention have the structure:

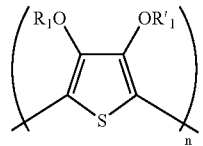

wherein:

$R_1$ and $R_1'$ are each independently selected from hydrogen an alkyl having 1 to 4 carbon atoms, or $R_1$ and $R_1'$ taken together form an alkylene chain having 1 to 4 carbon atoms, which may optionally be substituted by alkyl or aromatic groups having 1 to 12 carbon atoms, or a 1,2-cyclohexylene radical, and n is greater than about 6.

Thiophenes of this invention have the same general structure as provided above, wherein $R_1$ and $R_1'$ are substituted for the "$OR_1O$" and "$OR_1'$" substituents.

In a particular embodiment, $R_1$ and $R_1'$ taken together form an alkylene chain having 1 to 4 carbon atoms. In another embodiment, the polydioxythiophene is poly(3,4-ethylenedioxythiophene).

Colloid-forming polymeric acids contemplated for use in the practice of the invention are insoluble in water, and form colloids when dispersed into an aqueous medium. The polymeric acids typically have a molecular weight in the range of about 10,000 to about 4,000,000. In one embodiment, the polymeric acids have a molecular weight of about 100,000 to about 2,000,000. Colloid particle size typically ranges from 2 nanometers (nm) to about 140 nm. In one embodiment, the colloids have a particle size of 2 nm to about 30 nm. Any polymeric acid that is colloid-forming when dispersed in water is suitable for use in the practice of the invention. In one embodiment, the colloid-forming polymeric acid is polymeric sulfonic acid. Other acceptable polymeric acids include polymer phosphoric acids, polymer carboxylic acids, and polymeric acrylic acids, and mixtures thereof, including mixtures having polymeric sulfonic acids. In another embodiment, the polymeric sulfonic acid is fluorinated. In still another embodiment, the colloid-forming polymeric sulfonic acid is perfluorinated. In yet another embodiment, the colloid-forming polymeric sulfonic acid is a perfluoroalkylenesulfonic acid.

In still another embodiment, the colloid-forming polymeric acid is a highly-fluorinated sulfonic acid polymer ("FSA polymer"). "Highly fluorinated" means that at least about 50% of the total number of halogen and hydrogen atoms in the polymer are fluorine atoms, an in one embodiment at least about 75%, and in another embodiment at least about 90%. In one embodiment, the polymer is perfluorinated. The term "sulfonate functional group" refers to either to sulfonic acid groups or salts of sulfonic acid groups, and in one embodiment alkali metal or ammonium salts. The functional group is represented by the formula—$SO_3X$ where X is a cation, also known as a "counterion". X may be H, Li, Na, K or $N(R_1)(R_2)(R_3)(R_4)$, and $R_1$, $R_2$, $R_3$, and $R_4$ are the same or different and are and in one embodiment H, $CH_3$ or $C_2H_5$. In another embodiment, X is H, in which case the polymer is said to be in the "acid form". X may also be multivalent, as represented by such ions as $Ca^{++}$, and $Al^{+++}$. It is clear to the skilled artisan that in the case of multivalent counterions, represented generally as $M^{n+}$, the number of sulfonate functional groups per counterion will be equal to the valence "n".

In one embodiment, the FSA polymer comprises a polymer backbone with recurring side chains attached to the backbone, the side chains carrying cation exchange groups. Polymers include homopolymers or copolymers of two or more monomers. Copolymers are typically formed from a non-functional monomer and a second monomer carrying the cation exchange group or its precursor, e.g., a sulfonyl fluoride group (—$SO_2F$), which can be subsequently hydrolyzed to a sulfonate functional group. For example, copolymers of a first fluorinated vinyl monomer together with a second fluorinated vinyl monomer having a sulfonyl fluoride group (—SO₂F) can be used. Possible first monomers include tetrafluoroethylene (TFE), hexafluoropropylene, vinyl fluoride, vinylidine fluoride, trifluoroethylene, chlorotrifluoroethylene, perfluoro(alkyl vinyl ether), and combinations thereof. TFE is a preferred first monomer.

In other embodiments, possible second monomers include fluorinated vinyl ethers with sulfonate functional groups or precursor groups which can provide the desired side chain in the polymer. Additional monomers, including ethylene, propylene, and R—CH=CH₂ where R is a perfluorinated alkyl group of 1 to 10 carbon atoms, can be incorporated into these polymers if desired. The polymers may be of the type referred to herein as random copolymers, that is copolymers made by polymerization in which the relative concentrations of the comonomers are kept as constant as possible, so that the distribution of the monomer units along the polymer chain is in accordance with their relative concentrations and relative reactivities. Less random copolymers, made by varying relative concentrations of monomers in the course of the polymerization, may also be used. Polymers of the type called block copolymers, such as that disclosed in European Patent Application No. 1 026 152 A1, may also be used.

In one embodiment, FSA polymers for use in the present invention include a highly fluorinated, and in one embodiment perfluorinated, carbon backbone and side chains represented by the formula

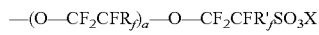

—(O—CF₂CFR$_f$)$_a$—O—CF₂CFR'$_f$SO₃X wherein Rf and R'f are independently selected from F, Cl or a perfluorinated alkyl group having 1 to 10 carbon atoms, a=0, 1 or 2, and X is H, Li, Na, K or N(R1)(R2)(R3)(R4) and R1, R2, R3, and R4 are the same or different and are and in one embodiment H, CH₃ or C₂H₅. In another embodiment X is H. As stated above, X may also be multivalent.

In one embodiment, the FSA polymers include, for example, polymers disclosed in U.S. Pat. No. 3,282,875 and in U.S. Pat. Nos. 4,358,545 and 4,940,525. An example of preferred FSA polymer comprises a perfluorocarbon backbone and the side chain represented by the formula

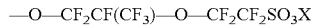

—O—CF₂CF(CF₃)—O—CF₂CF₂SO₃X where X is as defined above. FSA polymers of this type are disclosed in U.S. Pat. No. 3,282,875 and can be made by copolymerization of tetrafluoroethylene (TFE) and the perfluorinated vinyl ether CF₂=CF—O—CF₂CF(CF₃)—O—CF₂CF₂SO₂F, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a polymer of the type disclosed in U.S. Pat. Nos. 4,358,545 and 4,940,525 has the side chain —O—CF₂CF₂SO₃X, wherein X is as defined above. This polymer can be made by copolymerization of tetrafluoroethylene (TFE) and the perfluorinated vinyl ether CF₂=CF—O—CF₂CF₂SO₂F, perfluoro(3-oxa-4-pentenesulfonyl fluoride) (POPF), followed by hydrolysis and further ion exchange as necessary.

In one embodiment, the FSA polymers for use in this invention typically have an ion exchange ratio of less than about 33. In this application, "ion exchange ratio" or "IXR" is defined as number of carbon atoms in the polymer backbone in relation to the cation exchange groups. Within the range of less than about 33, IXR can be varied as desired for the particular application. In one embodiment, the IXR is about 3 to about 33, and in another embodiment about 8 to about 23.

The cation exchange capacity of a polymer is often expressed in terms of equivalent weight (EW). For the purposes of this application, equivalent weight (EW) is defined to be the weight of the polymer in acid form required to neutralize one equivalent of sodium hydroxide. In the case of a sulfonate polymer where the polymer has a perfluorocarbon backbone and the side chain is —O—CF₂—CF(CF₃)—O—CF₂—CF₂—SO₃H (or a salt thereof), the equivalent weight range which corresponds to an IXR of about 8 to about 23 is about 750 EW to about 1500 EW. IXR for this polymer can be related to equivalent weight using the formula: 50 IXR+344=EW. While the same IXR range is used for sulfonate polymers disclosed in U.S. Pat. Nos. 4,358,545 and 4,940,525, e.g., the polymer having the side chain —O—CF₂CF₂SO₃H (or a salt thereof), the equivalent weight is somewhat lower because of the lower molecular weight of the monomer unit containing a cation exchange group. For the preferred IXR range of about 8 to about 23, the corresponding equivalent weight range is about 575 EW to about 1325 EW. IXR for this polymer can be related to equivalent weight using the formula: 50 IXR+178=EW.

The FSA polymers can be prepared as colloidal aqueous dispersions. They may also be in the form of dispersions in other media, examples of which include, but are not limited to, alcohol, water-soluble ethers, such as tetrahydrofuran, mixtures of water-soluble ethers, and combinations thereof. In making the dispersions, the polymer can be used in acid form. U.S. Pat. Nos. 4,433,082, 6,150,426 and WO 03/006537 disclose methods for making of aqueous alcoholic dispersions. After the dispersion is made, concentration and the dispersing liquid composition can be adjusted by methods known in the art.

Aqueous dispersions of the colloid-forming polymeric acids, including FSA polymers, typically have particle sizes as small as possible and an EW as small as possible, so long as a stable colloid is formed.

Aqueous dispersions of FSA polymer are available commericially as Nafion® dispersions, from E. I. du Pont de Nemours and Company (Wilmington, Del.).

In one embodiment, thiophene or the dioxythiophene monomers are oxidatively polymerized in water containing polymeric acid colloids. Typically, the thiophene or dioxythiophene monomers are combined with or added to an aqueous dispersion containing a polymerization catalyst, an oxidizing agent, and colloidal polymeric acid particles dispersed therein. In this embodiment, the order of combination or addition may vary provided that the oxidizer and catalyst is not combined with the monomer until one is ready for the polymerization reaction to proceed.

Polymerization catalysts include, but are not limited to, ferric sulfate, ferric chloride, and the like and mixtures thereof.

Oxidizing agents include, but are not limited to, sodium persulfate, potassium persulfate, ammonium persulfate, and the like, including combinations thereof. The oxidative polymerization results in a stable, aqueous dispersion containing positively charged conductive polymeric thiophene and/or dioxythiophene that is charged balanced by the negatively charged side chains of the polymeric acids contained within the colloids, for example, sulfonate anion, carboxylate anion, acetylate anion, phosphonate anion, combinations, and the like.

In one embodiment of the method of making the aqueous dispersions of polydioxythiophene and at least one colloid-forming polymer acid include: (a) providing an aqueous dispersion of a polylmer acid; (b) adding an oxidizer to the dispersion of step (a); (c) adding a catalyst to the dispersion of step (b); and (d) adding a dioxythiophene monomer to the dispersion of step (c). One alternative embodiment to the above described method includes adding the dioxythiophene monomer to the aqueous dispersion of a polymeric acid prior to adding the oxidizer. Another embodiment, is to create a homogenous aqueous mixture of water and the polydioxythiophene, of any number of polyoxythiopene concentrations in water which is typically in the range of about 0.5% by weight to about 2.0% by weight polyoxythiopene, and add this polydioxythiophene mixture to the aqueous dispersion of the polymeric acid before adding the oxidizer and catalyst.

The polymerization can be carried out in the presence of co-dispersing liquids which are miscible with water. Examples of suitable co-dispersing liquids include, but are not limited to ethers, alcohols, al ethers, cyclic ethers, ketones, nitrites, sulfoxides, and combinations thereof. In one embodiment, the amount of co-dispersing liquid should be less than 30% by volume. In one embodiment, the amount of co-dispersing liquid is less than 60% by volume. In one embodiment, the amount of co-dispersing liquid is between 5% to 50% by volume. In one embodiment, the co-dispersing liquid is an alcohol. In one embodiment, the co-dispersing liquid is selected from n-propanol, isopropanol, t-butanol, methanol dimethylacetamide, dimethylformamide, N-methylpyrrolidone. The acid can be an inorganic acid, such as HCl, sulfuric acid, and the like, or an organic acid, such as p-toluenesulfonic acid, dodecylbenzenesulfonic acid, methanesulfonic acid, trifluoromethanesulfonic acid, camphorsulfonic acid, acetic acid and the like. Alternatively, the acid can be a water soluble polymeric acid such as poly(styrenesulfonic acid), poly(2-acrylamido-2-methyl-1-propanesulfonic acid, or the like, or a second colloid-forming acid, as described above. Combinations of acids can be used.

The co-acid can be added to the reaction mixture at any point in the process prior to the addition of either the oxidizer or the thiophene monomer, whichever is added last. In one embodiment, the co-acid is added before both the thiophene monomer and the colloid-forming polymeric acid, and the oxidizer is added last. In one embodiment the co-acid is added prior to the addition of the thiophene monomer, followed by the addition of the colloid-forming polymeric acid, and the oxidizer is added last.

The co-dispersing liquid can be added to the reaction mixture at any point prior to the addition of the oxidizer, catalyst, or monomer, whichever is last.

Optionally, after completion of any of the methods described above and completion of the polymerization reaction, the as-synthesized aqueous dispersion is contacted with at least one ion exchange resin under conditions suitable to produce a stable, aqueous dispersion. In one embodiment, the as-synthesized aqueous dispersion is contacted with a first ion exchange resin and a second ion exchange resin.

In another embodiment, the first ion exchange resin is an acidic, cation exchange resin, such as a sulfonic acid cation exchange resin set forth above, and the second ion exchange resin is a basic, anion exchange resin, such as a tertiary amine or a quaternary exchange resin.

Ion exchange is a reversible chemical reaction wherein an ion in a fluid medium (such as an aqueous dispersion) is exchanged for a similarly charged ion attached to an immobile solid particle that is insoluble in the fluid medium. The term "ion exchange resin" is used herein to refer to all such substances. The resin is rendered insoluble due to the crosslinked nature of the polymeric support to which the ion exchanging groups are attached. Ion exchange resins are classified as acidic, cation exchangers, which have positively charged mobile ions available for exchange, and basic, anion exchangers, whose exchangeable ions are negatively charged.

Both acidic, cation exchange resins and basic, anion exchange resins are contemplated for use in the practice of the invention. In one embodiment, the acidic, cation exchange resin is an organic acid, cation exchange resin, such as a sulfonic acid cation exchange resin. Sulfonic acid cation exchange resins contemplated for use in the practice of the invention include, for example, sulfonated styrene-divinylbenzene copolymers, sulfonated crosslinked styrene polymers, phenol-formaldehyde-sulfonic acid resins, benzene-formaldehyde-sulfonic acid resins, and mixtures thereof. In another embodiment, the acidic, cation exchange resin is an organic acid, cation exchange resin, such as carboxylic acid, acrylic or phosphoric acid cation exchange resin. In addition, mixtures of different cation exchange resins can be used. In many cases, the basic ion exchange resin can be used to adjust the pH to the desired level. In some cases, the pH can be further adjusted with an aqueous basic solution such as a solution of sodium hydroxide, ammonium hydroxide, tetramethylammonium hydroxide, or the like.

In another embodiment, the basic, anionic exchange resin is a tertiary amine anion exchange resin. Tertiary amine anion exchange resins contemplated for use in the practice of the invention include, for example, tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof. In a further embodiment, the basic, anionic exchange resin is a quaternary amine anion exchange resin, or mixtures of these and other exchange resins.

The first and second ion exchange resins may contact the as-synthesized aqueous dispersion either simultaneously, or consecutively. For example, in one embodiment both resins are added simultaneously to an as-synthesized aqueous dispersion of an electrically conducting polymer, and allowed to remain in contact with the dispersion for at least about 1 hour, e.g., about 2 hours to about 20 hours. The ion exchange resins can then be removed from the dispersion by filtration. The size of the filter is chosen so that the relatively large ion exchange resin particles will be removed while the smaller dispersion particles will pass through. Without wishing to be bound by theory, it is believed that the ion exchange resins quench polymerization and effectively remove ionic and non-ionic impurities and most of unreacted monomer from the as-synthesized aqueous dispersion. Moreover, the basic, anion exchange and/or acidic, cation exchange resins renders the acidic sites more basic, resulting in increased pH of the dispersion. In general, at least 1 gram of ion exchange is used per about 1 gram of colloid-forming polymeric acid. In other embodiments, the use of the ion exchange resin is used in a ratio of up to about 5 grams of ion exchange resin to polythiophene/polymeric acid colloid and depends on the pH that is to be achieved. In one embodiment, about one gram of Lewatit® MP62 WS, a weakly basic anion exchange resin from Bayer GmbH, and about one gram of Lewatit® MonoPlus S100, a strongly acidic, sodium cation exchange resin from Bayer, GmbH, are used per gram of the composition of polydioxythiophene and at least one colloid-forming polymeric acid.

In one embodiment, the aqueous dispersion resulting from polymerization of dioxythiophene with fluorinated polymeric sulfonic acid colloids is to charge a reaction vessel first with an aqueous dispersion of the fluorinated polymer. To this is added, in order, the oxidizer, catalyst and dioxythiophene monomer; or, in order, the dioxythiophene monomer, the oxidizer and catalyst. The mixture is stirred and the reaction is then allowed to proceed at a controlled temperature. When polymerization is completed, the reaction is quenched with a strong acid cation resin and a base anion exchange resin, stirred and filtered. Alternatively, the dioxythiophene can be added to water and stirred to homogenize the mixture prior to addition of Nafion® dispersion, followed with oxidizing agent and catalyst. The oxidizer:monomer ratio is generally in the range of 0.5 to 2.0 The fluorinated polymer:dioxythiophene monomer ratio is generally in the range of 1 to 4. The overall solid content is generally in the range of 1.5% to 6%; and in one embodiment 2% to 4.5%. The reaction temperature is generally in the range of 5° C. to 50° C.; and in one embodiment 20° C. to 35° C. The reaction time is generally in the range of 1 to 30 hours.

As synthesized aqueous dispersions of polythiophenes polymer acid colloids, including, polydioxythiophenes and fluorinated polymeric sulfonic acid colloids, can have a wide range of pH and can be adjusted to typically be between about 1 to about 8, and generally have a pH of about 3-4. It is frequently desirable to have a higher pH, as the acidity can be corrosive. It has been found that the pH can be adjusted using known techniques, for example, ion exchange or by titration with an aqueous basic solution. Stable dispersions of polydioxythiophenes and fluorinated polymeric sulfonic acid colloids with a pH up to 7-8 have been formed. Aqueous dispersions of polythiophenes and other colloid-forming polymeric acids can be similarly treated to adjust the pH.

In another embodiment, more conductive dispersions are formed by the addition of highly conductive additives to the aqueous dispersions of polydioxythiophene and the colloid-forming polymeric acid. Because dispersions with relatively high pH can be formed, the conductive additives, especially metal additives, are not attacked by the acid in the dispersion. Moreover, because the polymeric acids are colloidal in nature, having the surfaces predominately containing acid groups, electrically conducting polythiophene is formed on the colloidal surfaces. Because of this unique structure, only a low weight percentage of highly conductive additives, is needed to reach the percolation threshhold. Examples of suitable conductive additives include, but are not limited to metal particles and nanoparticles, nanowires, carbon nanotubes, graphite fibers or particles, carbon particles, and combinations thereof.

In another embodiment of the invention, there are provided buffer layers cast from aqueous dispersions comprising polythiophenes and colloid-forming polymeric acids, including as one embodiment polydioxythiophene and colloid-forming polymeric acids. In one embodiment, the buffer layers are cast from aqueous dispersions comprising colloid-forming polymeric sulfonic acid. In one embodiment, the buffer layer is cast from an aqueous dispersion containing poly(alkylenedioxythiophene) and fluorinated polymeric acid colloids. In another embodiment, the fluorinated polymeric acid colloids are fluorinated polymeric sulfonic acid colloids. In still another embodiment, the buffer layer is cast from an aqueous dispersion containing poly(3,4-ethylenedioxythiophene) and perfluoroethylenesulfonic acid colloids.

The dried films of polythiophenes, including polydioxythiophenes, and polymer acid colloids, such as fluorinated polymeric sulfonic acid colloids are generally not redispersible in water. Thus the buffer layer can be applied as multiple thin layers. In addition, the buffer layer can be overcoated with a layer of different water-soluble or water-dispersible material without being damaged.

In another embodiment, there are provided buffer layers cast from aqueous dispersions comprising polythiophene, including polymeric dioxythiophene, and colloid-forming polymeric acids blended with other water soluble or dispersible materials. Depending on the final application of the material, examples of types of additional water soluble or dispersible materials which can be added include, but are not limited to polymers, dyes, coating aids, carbon nanotubes, nanowires, organic and inorganic conductive inks and pastes, charge transport materials, crosslinking agents, and combinations thereof. The materials can be simple molecules or polymers. Examples of suitable other water soluble or dispersible polymers include, but are not limited to, conductive polymers such as polythiophenes, polyanilines, polyamines, polypyrroles, polyacetylenes, and combinations thereof.

In another embodiment of the invention, there are provided electronic devices comprising at least one electroactive layer (usually a semiconductor conjugated polymer) positioned between two electrical contact layers, wherein at least one of the layers of the device includes the buffer layer of the invention. One embodiment of the present invention is illustrated in one type of OLED device, as shown in FIG. 1, which is a device that has anode layer 110, a buffer layer 120, an electroluminescent layer 130, and a cathode layer 150. Adjacent to the cathode layer 150 is an optional electron-injection/transport layer 140. Between the buffer layer 120 and the cathode layer 150 (or optional electron injection/transport layer 140) is the electroluminescent layer 130.

The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), aluminum-tin-oxide, gold, silver, copper, and nickel. The anode may also comprise an organic material such as polyaniline or polypyrrole. The IUPAC number system is used throughout, where the groups from the Periodic Table are numbered from left to right as 1-18 (CRC Handbook of Chemistry and Physics, 81$^{st}$ Edition, 2000).

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

The anode layer 110 may be patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 typically is formed into substantially parallel strips having lengths that extend in substantially the same direction.

The buffer layer 120 is usually cast onto substrates using a variety of techniques well-known to those skilled in the art. Typical casting techniques include, for example, solution casting, drop casting, curtain casting, spin-coating, screen printing, inkjet printing, and the like. Alternatively, the buffer layer can be patterned using a number of depositing processes, such as ink jet printing.

The electroluminescent (EL) layer 130 may typically be a conjugated polymer, such as poly(paraphenylenevinylene), abbreviated as PPV, or polyfluorene. The particular material chosen may depend on the specific application, potentials used during operation, or other factors. The EL layer 130 containing the electroluminescent organic material can be applied from solutions by any conventional technique, including spin-coating, casting, and printing. The EL organic materials can be applied directly by vapor deposition processes, depending upon the nature of the materials. In another embodiment, an EL polymer precursor can be applied and then converted to the polymer, typically by heat or other source of external energy (e.g., visible light or UV radiation).

Optional layer 140 can function both to facilitate electron injection/transport, and can also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include, but are not limited to, metal-chelated oxinoid compounds (e.g., $Alq_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4triazole ("TAZ" or the like); other similar compounds; or any one or more combinations thereof. Alternatively, optional layer 140 may be inorganic and comprise BaO, LiF, $Li_2O$, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs,), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include, but are not limited to, barium, lithium, cerium, cesium, europium, rubidium, yttrium, magnesium, samarium, and alloys and combinations thereof.

The cathode layer 150 is usually formed by a chemical or physical vapor deposition process. In general, the cathode layer will be patterned, as discussed above in reference to the anode layer 110. If the device lies within an array, the cathode layer 150 may be patterned into substantially parallel strips, where the lengths of the cathode layer strips extend in substantially the same direction and substantially perpendicular to the lengths of the anode layer strips. Electronic elements called pixels are formed at the cross points (where an anode layer strip intersects a cathode layer strip when the array is seen from a plan or top view).

In other embodiments, additional layer(s) may be present within organic electronic devices. For example, a layer (not shown) between the buffer layer 120 and the EL layer 130 may facilitate positive charge transport, band-gap matching of the layers, function as a protective layer, or the like. Similarly, additional layers (not shown) between the EL layer 130 and the cathode layer 150 may facilitate negative charge transport, band-gap matching between the layers, function as a protective layer, or the like. Layers that are known in the art can be used. In addition, any of the above-described layers can be made of two or more layers. Alternatively, some or all of inorganic anode layer 110, the buffer layer 120, the EL layer 130, and cathode layer 150, may be surface treated to increase charge carrier transport efficiency. The choice of materials for each of the component layers may be determined by balancing the goals of providing a device with high device efficiency with the cost of manufacturing, manufacturing complexities, or potentially other factors.

The different layers may have any suitable thickness. Inorganic anode layer 110 is usually no greater than approximately 500 nm, for example, approximately 10-200 nm; buffer layer 120, is usually no greater than approximately 250 nm, for example, approximately 50-200 nm; EL layer 130, is usually no greater than approximately 1000 nm, for example, approximately 50-80 nm; optional layer 140 is usually no greater than approximately 100 nm, for example, approximately 20-80 nm; and cathode layer 150 is usually no greater than approximately 100 nm, for example, approximately 1-50 nm. If the anode layer 110 or the cathode layer 150 needs to transmit at least some light, the thickness of such layer may not exceed approximately 100 nm.

Depending upon the application of the electronic device, the EL layer 130 can be a light-emitting layer that is activated by signal (such as in a light-emitting diode) or a layer of material that responds to radiant energy and generates a signal with or without an applied potential (such as detectors or voltaic cells). After reading this specification, skilled artisans will be capable of selecting material(s) that are suitable for their particular applications. The light-emitting materials may be dispersed in a matrix of another material, with or without additives, and may form a layer alone. The EL layer 130 generally has a thickness in the range of approximately 50-500 nm.

Examples of other organic electronic devices that may benefit from having one or more layers comprising the aqueous dispersion polythiophenes made with polymeric acid colloids include (1) devices that convert electrical energy into radiation (e.g., a light-emitting diode, light emitting diode display, or diode laser), (2) devices that detect signals through electronics processes (e.g., photodetectors (e.g., photoconductive cells, photoresistors, photoswitches, phototransistors, phototubes), IR detectors), (3) devices that convert radiation into electrical energy, (e.g., a photovoltaic device or solar cell), and (4) devices that include one or more electronic components that include one or more organic semi-conductor layers (e.g., a transistor or diode).

In organic light emitting diodes (OLEDs), electrons and holes, injected from the cathode 150 and anode 110 layers, respectively, into the EL layer 130, form negative and positively charged polar ions in the polymer. These polar ions migrate under the influence of the applied electric field, forming a polar ion exciton with an oppositely charged species and subsequently undergoing radiative recombination. A sufficient potential difference between the anode and cathode, usually less than approximately 12 volts, and in many instances no greater than approximately 5 volts, may be applied to the device. The actual potential difference may depend on the use of the device in a larger electronic component. In many embodiments, the anode layer 110 is biased to a positive voltage and the cathode layer 150 is at substantially ground potential or zero volts during the operation of the electronic device. A battery or other power source(s) may be electrically connected to the electronic device as part of a circuit but is not illustrated in FIG. 1.

OLEDs provided with buffer layers cast from aqueous dispersions comprising polymeric dioxythiophene and colloid-forming polymeric acids have been found to have improved lifetimes. The buffer layer may be cast from an aqueous dispersion of polydioxythiophene and fluorinated polymeric sulfonic acid colloids; an in one embodiment is an aqueous dispersion in which the pH has been adjusted to above about 3.5.

Using a less acidic or pH neutral material leads to significantly less etching of the ITO layer during device fabrication and hence much lower concentration of In and Sn ions diffusing into the polymer layers of the OLED. Since In and Sn ions are suspected to contribute to reduced operating lifetime this is a significant benefit.

The lower acidity also reduces corrosion of the metal components of the display (e.g. electrical contact pads) during fabrication and over the long-term storage. PEDT/PSSA residues will interact with residual moisture to release acid into the displays with resulting slow corrosion.

Equipment used to dispense the acidic PEDT/PSSA needs to be specially designed to handle the strong acidity of PEDT/PSSA. For example, a chrome-plated slot-die coating-head used to coat the PEDT/PSSA onto ITO substrates was found to be corroding due to the acidity of the PEDT/PSSA. This rendered the head unusable since the coated film became contaminated with particles of chrome. Also, certain ink-jet print heads are of interest for the fabrication of OLED displays. They are used for dispensing both the buffer layer and the light-emitting polymer layer in precise locations on the display. These print-heads contain nickel mesh filters as an internal trap for particles in the ink. These nickel filters are decomposed by the acidic PEDT/PSSA and rendered unusable. Neither of these corrosion problems will occur with the aqueous PEDT dispersions of the invention in which the acidity has been lowered.

Furthermore, certain light-emitting polymers are found to be sensitive to acidic conditions, and their light-emitting capability is degraded if they are in contact with an acidic buffer layer. It is advantageous to use the aqueous PEDT dispersions of the invention to form the buffer layer because of the lower acidity or neutrality.

The fabrication of full-color or area-color displays using two or more different light-emitting materials becomes complicated if each light-emitting material requires a different cathode material to optimize its performance. Display devices are made up of a multiplicity of pixels which emit light. In multicolor devices there are at least two different types of pixels (sometimes referred to as sub-pixels) emitting light of different colors. The sub-pixels are constructed with different light-emitting materials. It is very desirable to have a single cathode material that gives good device performance with all of the light emitters. This minimizes the complexity of the device fabrication. It has been found that a common cathode can be used in multicolor devices where the buffer layer is made from the aqueous PEDT dispersions of the invention while maintaining good device performance for each of the colors. The cathode can be made from any of the materials discussed above; and may be barium, overcoated with a more inert metal such as aluminum.

Other organic electronic devices that may benefit from having one or more layers comprising the aqueous dispersion of polythiophene, including polydioxythiophene, and at least one colloid-forming polymeric acids include (1) devices that convert electrical energy into radiation (e.g., a light-emitting diode, light emitting diode display, or diode laser), (2) devices that detect signals through electronics processes (e.g., photodetectors (e.g., photoconductive cells, photoresistors, photoswitches, phototransistors, phototubes), IR detectors), (3) devices that convert radiation into electrical energy, (e.g., a photovoltaic device or solar cell), and (4) devices that include one or more electronic components that include one or more organic semi-conductor layers (e.g., a transistor or diode).

The buffer layer can further be overcoated with a layer of conductive polymer applied from aqueous solution or solvent. The conductive polymer can facilitate charge transfer and also improve coatability. Examples of suitable conductive polymers include, but are not limited to, polyanilines, polythiophenes, polydioxythiophene/polystyrenesulfonic acid, polyaniline-polymeric-acid-colloids as disclosed in co-pending application DuPont number UC 0223, polypyrroles, polyacetylenes, and combinations thereof.

In yet another embodiment of the invention, there are provided thin film field effect transistors comprising electrodes comprising polydioxythiophenes and colloid-forming polymeric sulfonic acids. For use as electrodes in thin film field effect transistors, the conducting polymers and the liquids for dispersing or dissolving the conducting polymers must be compatible with the semiconducting polymers and the solvents for the semiconducting polymers to avoid re-dissolution of either conducting polymers or semiconducting polymers. Thin film field effect transistor electrodes fabricated from conducting polymers should have a conductivity greater than 10 S/cm. However, electrically conducting polymers made with water soluble polymeric acids only provide conductivity in the range of $\sim 10^{-3}$ S/cm or lower. Thus, in one embodiment, the electrodes comprise poly(alkylenedioxythiophene) and fluorinated colloid-forming polymeric sulfonic acids in combination with electrical conductivity enhancers such as nanowires, carbon nanotubes, or the like. In still another embodiment, the electrodes comprise poly(3,4-ethylenedioxythiophene) and colloid-forming perfluoroethylenesulfonic acid in combination with electrical conductivity enhancers such as nanowires, carbon nanotubes, or the like. Invention compositions may be used in thin film field effect transistors as gate electrodes, drain electrodes, or source electrodes.

Figure 2:
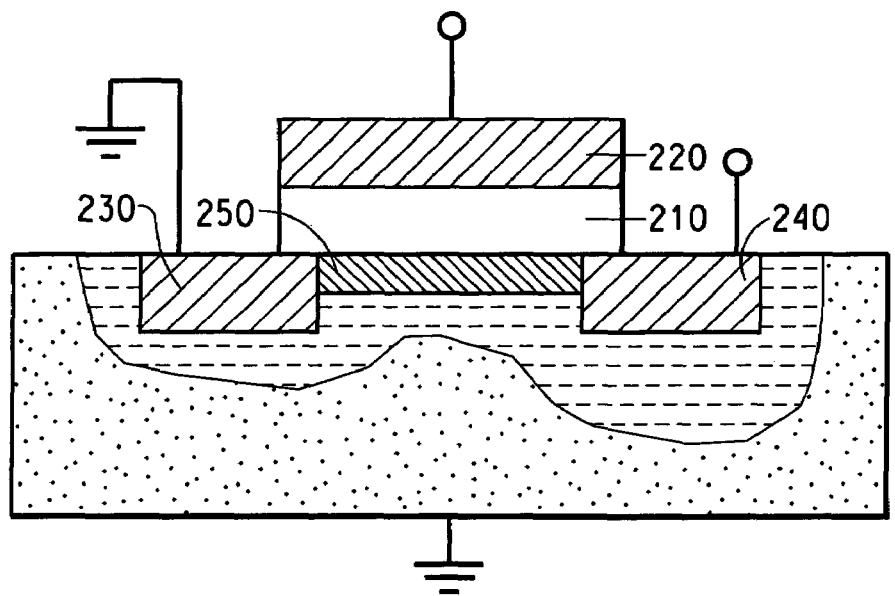
FIG. 2 illustrates a cross-sectional view of a thin film field effect transistor that includes an electrode according to the invention.

Another illustration of the present invention, is the thin film field effect transistors, is shown in FIG. 2. In this illustration, a dielectric polymer or dielectric oxide thin film 210 has a gate electrode 220 on one side and drain and source electrodes, 230 and 240, respectively, on the other side. Between the drain and source electrode, an organic semiconducting film 250 is deposited. Invention aqueous dispersions containing nanowires or carbon nanotubes are ideal for the applications of gate, drain and source electrodes because of their compatibility with organic based dielectric polymers and semiconducting polymers in solution thin film deposition. Since the invention conducting compositions, e.g., in one embodiment PEDT and colloidal perfluoroethylene sulfonic acid, exist as a colloidal dispersion, less weight percentage of the conductive fillers is required (relative to compositions containing water soluble polymeric sulfonic acids) to reach percolation threshold for high electrical conductivity.

In still another embodiment of the invention, there are provided methods for producing, aqueous dispersions of polydioxythiophenes comprising polymerizing dioxythiophene monomers in the presence of polymeric sulfonic acid colloids. In one embodiment of the invention methods, the polydioxythiophene is a polyalkylenedioxythiophene and the colloid-forming polymeric sulfonic acid is fluorinated. In another embodiment of the invention methods, the polydioxythiophene is poly(3,4-ethylenedioxythiophene) and the colloid-forming polymeric sulfonic acid is perfluorinated. In still another embodiment, the colloid-forming polymeric sulfonic acid is perfluoroethylenesulfonic acid. The polymerization is carried out in the presence of water. The resulting reaction mixture can be treated with ion exchange resins to remove reaction byproducts.

The invention will now be described in greater detail by reference to the following non-limiting examples.

EXAMPLES

Comparative Example 1

This Comparative Example demonstrates the oxidative polymerization of ethylenedioxythiophene in the presence of a water soluble, polymeric sulfonic acid, i.e., poly(styrenesulfonic acid) (PSSA), to produce a non-colloidal poly(ethylenedioxythiophene)/poly(styrenesulfonic acid) (PEDT/PSSA) complex.

A solution of ferric sulfate was prepared by dissolving 0.3246 g of ferric sulfate hydrate (Sigma-Aldrich Corp., St. Louis, Mo., USA) in deionized water to produce a solution with a total weight of 39.4566 g. 2.28 g of this ferric sulfate solution was mixed in a plastic bottle with 300 g of deionized water, 10.00 g of PSSA (30 wt % PSSA, 70,000 molecular weight, PolySciences, Inc., Warmington, Pa., USA) and 1.72 g sodium persulfate (Fluka, Sigma-Aldrich Corp., St. Louis, Mo., USA). The ferric sulfate acts as a catalyst for the polymerization and the sodium persulfate is an oxidizing agent for the oxidative polymerization of ethylenedioxythiophene. The mixture was swirled and then placed in a 3-necked 500 mL flask equipped with a thermal well for a thermocouple. The mixture was stirred with a stirring paddle powered by an air-driven overhead stirrer while 0.63 mL of 3,4-ethylenedioxythiophene (Baytron-M® obtained from Bayer, Pittsburgh, Pa., USA) was added to the PSSA-containing mixture. The polymerization of the 3,4-ethylenedioxythiophene was allowed to proceed for 24 hours at room temperature, i.e., about 22° C. As a result of the polymerization, the clear liquid changed to a dark colored liquid, having the color of the PEDT/PSSA complex dispersed in water. The PEDT/PSSA complex dispersion was tested for filterability with a 5.0 µm Millex®-SV syringe filter from Millipore Corp. (Bedford, Mass., USA). Only clear colorless liquid went through the filter, with a high hand pressure exerted against the syringe plunger, thereby indicating that the PEDT/PSSA complex particles were too large to pass through the filter.

One half of the aqueous dispersion of the PEDT/PSSA complex, which amounted to about 158 g, was further treated with two ion exchange resins. One is a cation exchanger, sodium sulfonate of crosslinked polystyrene, (Lewatit® S100 WS, obtained from Bayer, Pittsburgh, Pa., USA). The other is an anion exchanger, free base/chloride of tertiary/quaternary amine of crosslinked polystyrene, (Lewatit® MP62 WS, obtained from Bayer, Pittsburgh, Pa., USA). 53 g of Lewatit® S100 WS and 51 g of Lewatit® MP62 WS were each washed with deionized water until there was no color in the water. The two washed resins were then filtered before being mixed with the 158 g of the aqueous dispersion of the PEDT/PSSA complex. The mixture was stirred with a magnetic stirrer for 8 hours. The resins were removed by filtration. It was determined that the aqueous dispersion of the resin-treated PEDT/PSSA complex contained 1.2 wt % solid based on a gravimetric analysis. The aqueous dispersion of the resin-treated PEDT/PSSA was then tested for filterability with a 5.0 µm Millex®-SV syringe filter from Millipore Corp. (Bedford, Mass., USA) and a 1.2 µm GF/C syringe filter from Whatman Inc. (Clifton, N.J., USA). The dispersion passed through the 5.0 µm Millex®-SV syringe filter, but only clear colorless liquid passed through the 1.2 µm GF/C syringe filter with a high hand pressure exerted against the syringe plunger. The average particle size of the resin-treated PEDT/PSSA complex particles was measured by light scattering as described above and found to be 1.12 µm (average of five measurements with standard deviation of 0.04 µm) with polydispersity of 0.40.

The resin-treated PEDT/PSSA complex was then tested for electrical conductivity and light emission properties. Commercially available indium tin oxide (ITO)/glass plates having ITO layers 100 to 150 nm thick were cut into samples 30 mm×30 mm in size. The ITO layers were subsequently etched with oxygen plasma. The ITO on the glass substrates to be used for electrical conductivity measurements were etched into a series of parallel lines of ITO to be used as electrodes. The ITO on the substrates to be made into LEDs for light emission measurement were etched into a 15 mm×20 mm layer of ITO to serve as the anode. The aqueous dispersion of the resin-treated PEDT/PSSA complex was spin-coated onto each of the ITO/glass substrates at a spinning speed of 1200 rpm. The resulting PEDT/PSSA complex layer was about 140 nm thick. The layer quality was not uniform. The PEDT/PSSA complex coated ITO/glass substrates were dried in nitrogen at 90° C. for 30 minutes.

Electrical conductivity of the PEDT/PSSA complex layer was determined by measuring the resistance between two electrodes and was calculated to be $6.1 \times 10^{-3}$ S/cm based on the resistance, the thickness of the conductive layer and the distance between the two electrodes used to measure the resistance.

For light emission measurements, the PEDT/PSSA complex layer was then top-coated with a super-yellow emitter poly(substituted-phenylene vinylene) (PDY 131 obtained from Covion Company, Frankfurt, Germany) to serve as the active electroluminescent (EL) layer. The thickness of the EL layer was approximately 70 nm. All film thicknesses were measured with a TENCOR 500 Surface Profiler. For the cathode, Ba and Al layers were vapor deposited on top of the EL layer under a vacuum of $1.3 \times 10^{-4}$ Pa. The final thickness of the Ba layer was 3 nm; the thickness of the Al layer on top of the Ba layer was 300 nm. LED device performance was tested as follows. Measurements of current vs. applied voltage, light emission intensity vs. applied voltage, and light emission efficiency (candela/ampere-c/A) were measured with a Keithley 236 source-measure unit from Keithley Instrument Inc. (Cleveland, Ohio), and a S370 Optometer with a calibrated silicon photodiode (UDT Sensor, Inc., Hawthorne, Calif.). Five LED devices were tested by raising the applied voltage to obtain a light intensity of 200 cd/m². The average applied voltage to achieve this intensity was 5.0 volts and the average light efficiency was 5.4 cd/A. These devices had a stress half-life of less than one hour at 80° C.

Example 1

This Example illustrates polymerization of ethylenedioxythiophene in the presence of Nafion® and also describes properties of the poly(ethylenedioxyth iophene) obtained thereby.

142.68 g (16.03 mmoles of Nafion® monomer units) SE-10072 and 173.45 g deionized water were poured into a 500 mL Nalgenic® plastic bottle. A stock solution of ferric sulfate was made first by dissolving 0.0667 g ferric sulfate hydrate (97%, Sigma-Aldrich Corp., St. Louis, Mo., USA) with deionized water to a total weight of 12.2775 g. 1.40 g of the ferric sulfate solution and 1.72 g (7.224 mmoles) sodium persulfate (Fluka, Sigma-Aldrich Corp., St. Louis, Mo., USA) were then placed into the plastic bottle. The cap of the Nalgenic® plastic bottle was replaced tightly and the bottle was the shaken vigorously by hand. The bottle contents were poured into a jacketed 500 mL three-necked flask as described above. The mixture was then stirred for 30 minutes in the reaction vessel. 0.63 mL (5.911 mmoles) of Baytron-M (a trade name for 3,4-ethylenedioxythiophene from Bayer, Pittsburgh, USA) was added to the reaction mixture with stirring. Polymerization was allowed to proceed with stirring at about 23° C. In one hour and 7 minutes, the polymerization liquid turned very dark blue and was then distributed into two 250 mL plastic bottles. When dismantling the reaction vessel, no gel particles were noticed on the stirring shaft or on the glass wall of the reaction vessel. Total yield of the polymerization liquid was 297.10 g. The liquid contains 5.303% (w/w) solids assuming no loss and total conversion. The solid is presumed to contain primarily poly(3,4-ethylenedioxythiophene), PEDT/Nafion®.

148.75 g of the aqueous PEDT/Nafion® in one of the two plastic bottles was further treated with two ionic exchange resins. One of the two resins is Lewatit® S100, a trade name from Bayer, Pittsburgh, Pa., USA for sodium sulfonate of crosslinked polystyrene. The other ionic exchange resin is Lewatit® MP62 WS, a trade from Bayer, Pittsburgh, Pa., USA for free base/chloride of tertiary/quaternary amine of crosslinked polystyrene. Before use, the two resins were washed with deionized water separately until there was no color observed in the water. 7.75 g of Lewatit® S100 and 7.8 g of Lewatit® MP62® WS were then mixed with the 148.75 g aqueous PEDT/Nafion® dispersion in a plastic bottle. The bottle was then placed on a roller for stirring for about 23 hours. The resulting slurry was then suction-filtered through a coarse fritted-glass funnel. Yield was 110.2 g. Based on elemental analysis of the sample dried from a 2.6% (w/w) dispersion, the sample contains 21.75% carbon, 0.23% hydrogen, 1.06% nitrogen and 2.45% sulfur. Other elements such as oxygen and fluorine were not analyzed. To remove fluorine interference with sulfur analysis, $CeCl_3$ and a cation exchange resin was added.

10 g of the PEDT/Nafion® dispersion was mixed with 10.01 g deionized water, which constitutes 2.6% (w/w) solid based on a gravimetric analysis of dried solid. The aqueous PEDT/Nafion® dispersion was then tested for conductivity and light emission properties. The glass/ITO substrates (30 mm×30 mm) having ITO thickness of 100 to 150 nm and 15 mm×20 mm ITO area for light emission were cleaned and subsequently treated with oxygen plasma, as in Comparative Example 2. The aqueous PEDT/Nafion® dispersion was spin-coated onto the ITO/glass substrates at a spinning speed of 700 rpm to yield 96 nm thickness. The PEDT/Nafion® coated ITO/glass substrates were dried in a vacuum oven at 90° C. for 30 minutes. Electrical conductivity of the PEDT/Nafion® films was determined to be $2.4\times10^{-3}$ and $5.7\times10^{-4}$ S/cm.

The PEDT/Nafion® layer was then top-coated with a super-yellow emitter (PDY 131), which is a poly(substituted-phenylene vinylene) from Covion Company (Frankfurt, Germany). The thickness of the EL layer was approximately 70 nm. All film thicknesses were measured with a TENCOR 500 Surface Profiler. For the cathode, Ba and Al layers were vapor deposited on top of the EL layers under a vacuum of $1\times10^{-6}$ torr. The final thickness of the Ba layer was 30 Å; the thickness of the Al layer was 3000 Å. Device performance was tested as follows. Current vs. voltage, light emission intensity vs. voltage, and efficiency were measured with a Keithley 236 source-measure unit from Keithley Instrument Inc. (Cleveland, Ohio), and a S370 Optometer with a calibrated silicon photodiode from UDT Sensor, Inc. (Hawthorne, Calif.). Five light emitting devices tested showed operating voltage ranging from 3.2 to 3.3 volts and light emission efficiency ranging from 8.3 Cd/A to 9.8 Cd/A at 200 $Cd/m^2$ brightness. These devices have a stress half-life ranging from 243 to 303 hr at 80° C.

Comparative Example 2

This Comparative Example illustrates properties of solid films dried from a commercial aqueous PEDT dispersion made with water soluble poly(styrenesulfonic acid).

About 30 mL of Baytron-P VP Al 4083 (Lot# 06Y76982) from H. C. Starck, GmbH (Leverkusen, Germany) was dried to solid films in a glass beaker under a nitrogen flow at room temperature. The dried film flakes were mixed with about 10 mL deionized water and the mixture was shaken by hand. The water turned blue and became very dark as most of the flakes were re-dispersed in the water. The water also became very acidic, having a pH of zero using a color pHast® Indicator (pH 0-14 range) from EM Science (Gibbson, N.J., USA; cat# 9590).

Comparative Example 3

This Comparative Example illustrates moisture uptake of solid films dried from another commercial aqueous PEDT dispersion made with water soluble poly(styrenesulfonic acid):

About 30 mL of Baytron-P CH8000 (Lot# CHN0004) from H. C. Starck, GmbH (Leverkusen, Germany) was dried to solid films in a glass beaker under a nitrogen flow at room temperature. A major portion of the dried fims was tested for re-dispersibility and acidity in about 10 mL deionized water and found to behave as described in Comparative Example 2. A small portion of the dried film flakes was then allowed to equilibrate at ambient conditions before being analyzed for moisture uptake by a thermal gravimetric analyzer (at 20° C./min in nitrogen). The film flakes absorbed 29.4% water at ambient conditions. This result clearly demonstrates that the PEDT films are very hygroscopic and, any moisture so absorbed the water would become very acidic as illustrated in Comparative Example 2. Both VP Al 4083 and CH8000 PEDT are marketed for OLEDs as buffer layers.

Example 2

This Example illustrates properties of solid films dried from invention aqueous PEDT/Nafion®.

About 30 mL of the aqueous PEDT/Nafion® (2.6%) in Example 1 was dried to solid films in a glass beaker under a nitrogen flow at room temperature. A major portion of the dried film flakes was mixed with deionized water and the mixture was shaken by hand. The flakes stayed shiny, indicating that the films were not swollen. Surprisingly, the water was colorless, meaning that PEDT/Nafion® was not re-dispersible in water. Moreover, the water had a pH of 7 using a color pHast® Indicator (pH 0-14 range) from EM Science (Gibbson, N.J., USA; cat# 9590). This result clearly shows that the polymeric acid is not mobile. Furthermore, the result shows that the surface of the PEDT/Nafion®) is predominantly a conductive layer having the sulfonic acid anions charge-balanced by the PEDT.

A small portion of the dried film flakes was allowed to equilibrate at ambient conditions before being analyzed for moisture uptake by a thermal gravimetric analyzer (at 20° C./min in nitrogen). The film flakes absorbed only 5.6% water, which is far less than commercial PEDT as illustrated in Comparative Example 3. The low moisture uptake also shows that the surface of the PEDT/Nafion® is predominately a conductive layer having the sulfonic acid anions charge-balanced by the PEDT. This makes it less hydroscopic than the dried films prepared in Comparative Examples 2 and 3.

Example 3

This Example illustrates use of aqueous PEDT/Nafion® as electrodes in thin film field effect transistors.

A portion of the dried films described in Example 2 was mixed with toluene, chloroform or dichloromethane (common organic solvents used for dissolving organic semiconducting polymers for use in thin film field effect transistors). The film flakes were not swollen by either of the organic solvents nor did the flakes discolor the solvents. This result clearly demonstrates that PEDT/Nafion® films are compatible with organic solvents for semiconducting polymers. Because the electrically conducting polymers are cast from aqueous dispersions, the water will not attack semiconducting polymers which are only soluble in organic aromatic solvents, such as toluene, or chlorinated solvents such as chloroform or dichloromethane.

The aqueous PEDT/Nafion® dispersion (2.6%, w/w) prepared in Example 2 was tested for electrical conductivity. The glass/ITO substrates (30 mm×30 mm) having ITO thickness of 100 to 150 nm were cleaned and subsequently treated with oxygen plasma. The ITO substrates have parallel-etched ITO lines on them for resistance measurement. The aqueous PEDT/Nafion® dispersion was spin-coated onto the ITO/glass substrates. The PEDT/Nafion® coated ITO/glass substrates were dried in a vacuum oven at 90° C. for 30 minutes. Electrical conductivity of the PEDT/Nafion® films was determined to be $2.4 \times 10^{-3}$ and $5.7 \times 10^{-4}$ S/cm. The conductivity is lower than what is needed for thin film field effect transistor electrodes. However, use of the conducting PEDT/Nafion® where the conducting polymers exist as colloids in the dispersion allows for incorporation of conductive fillers such as nano-wire, nanoparticles of metal, or carbon nanotubes. For example, metallic molybdenum wires having a diameter of 15 nm and a conductivity of $1.7 \times 10^4$ S/cm are available and can be used to enhance conductivity, as described in Zach, et al., Science, Vol. 290, p 2120. Carbon nanotubes having a diameter of 8 nm, a length of 20 μm, and a conductivity of 60 S/cm are also available and can be used to enhance conductivity, as described in Niu, et al., *Appl. Phys. Lett.*, Vol. 70, p. 1480. Because of the colloidal nature of the PEDT/Nafion® and because the surface of the paritcles is predominately an electrically conductive layer, a lower weight percentage of the highly conductive fillers is needed to reach percolation threshold for high conductivity once the PEDT/Nafion® coalesces.

Example 4

This Example illustrates the polymerization of ethylendioxythiophene in the presence of Nafion® under varying conditions. Three different types of Nafion® resin were used: SE-10072, DE-1021, and DE-1020.

To a jacketed flask were added an aqueous Nafion® dispersion and water. The mixture was warmed to the temperature indicated and stirred for 45 minutes. To this mixture were added, in order, the oxidizer, catalyst and dioxythiophene monomer. After the addition was complete, the mixture was allowed to stir at the temperature indicated, for the time indicated. The reaction was then quenched with Lewatit® strong acid cation resin (sodium form) and Lewatit® weak base anion resin, either by batch treatment of the reaction mixture, or by passing through a column filled with these two ion exchange resins. The resulting slurry mixture was then stirred for 16 hours at room temperature and then filtered through filter paper (pore size>20-25 micrometer). The filtrate was then filtered through filter paper (pore size>6 micrometer). Finally, the filtrate obtained was filtered through a 0.45 micrometer filter. The resulting filtrate was formulated to a final product with the target solid content by adding DI was and mixed well by shaking. The polymerization parameters are summarized in Table 1 below.

TABLE 1

Summary of Synthesis of PEDT/Nafion ®

| Sample | Nafion Batch | Oxidizer/ Monomer | Nafion/ Monomer | Temp. (° C.) | Reaction Time (hr, min) | Ion Exchange | As is PEDT-Nafion (%) | Formulated PEDT-Nafion (%) |
|---|---|---|---|---|---|---|---|---|
| A | SE-10072 | 1.221 | 2.756 | 20.2 | 20, 49 | Batch | 2.81 | 2.8 |
| B | DE-1021 | 1.221 | 2.756 | 20.2 | 20, 47 | Batch | 2.81 | 2.8 |
| C | DE-1021 | 1.221 | 2.756 | 20.2 | 21, 00 | Column | 2.81 | 2.8 |
| D | DE-1020 | 1.221 | 2.756 | 20.2 | 21, 00 | Batch | 2.81 | 2.8 |
| E | DE-1020 | 1.221 | 2.756 | 20.1 | 21, 00 | Column | 2.81 | 2.8 |
| F | DE-1020 | 1.221 | 5.513 | 20.2 | 23, 15 | Column | 2.80 | 5.5 |
| G | DE-1021 | 1.221 | 5.513 | 20.2 | 44, 08 | Column | 2.80 | 5.9 |

TABLE 1-continued

Summary of Synthesis of PEDT/Nafion ®

| Sample | Nafion Batch | Oxidizer/ Monomer | Nafion/ Monomer | Temp. (° C.) | Reaction Time (hr, min) | Ion Exchange | As is PEDT-Nafion (%) | Formulated PEDT-Nafion (%) |
|---|---|---|---|---|---|---|---|---|
| H | DE-1020 | 1.221 | 5.513 | 20.2 | 24, 56 | Batch | 5.48 | 5.4 |
| I | DE-1020 | 0.50 | 3.00 | 20.2 | 23, 43 | Batch | 2.89 | 2.8 |
| J | DE-1020 | 1.50 | 3.00 | 20.1 | 24, 00 | Column | 2.69 | 2.6 |
| K | DE-1020 | 2.00 | 1.00 | 20.1 | 14, 52 | Batch | 3.04 | 3.0 |
| L | DE-1020 | 1.25 | 3.00 | 35.0 | 16, 34 | Batch | 6.04 | 3.4 |
| M | DE-1020 | 2.00 | 3.00 | 35.0 | 24, 05 | Column | 3.01 | 3.0 |
| N | DE-1020 | 1.25 | 3.00 | 35.0 | 14, 54 | Batch | 4.52 | 3.4 |
| O | DE-1020 | 1.5 | 3.00 | 35.0 | 14, 55 | Batch | 4.52 | 4.5 |
| P | DE-1020 | 0.75 | 3.00 | 35.0 | 24, 00 | Batch | 4.51 | 4.5 |
| Q | DE-1020 | 1.00 | 3.00 | 35.0 | 16, 36 | Batch | 4.52 | 3.8 |
| R | DE-1020 | 1.00 | 2.00 | 35.0 | 16, 31 | Batch | 4.52 | 4.5 |
| S | DE-1020 | 1.00 | 2.50 | 35.0 | 16, 28 | Batch | 4.52 | 3.0 |
| T | DE-1020 | 1.00 | 3.00 | 35.0 | 41, 17 | Batch | 3.51 | 3.5 |
| U | DE-1020 | 1.25 | 3.00 | 35.0 | 41, 19 | Batch | 3.51 | 3.5 |
| V | DE-1020 | 1.50 | 3.00 | 35.0 | 41, 22 | Batch | 3.51 | 3.5 |
| W | DE-1020 | 1.25 | 3.00 | 35.0 | 14, 02 | Column | 4.52 | 3.0 |
| X | DE-1020 | 1.00 | 2.75 | 35.0 | 14, 27 | Batch | 4.52 | 3.6 |
| Y | DE-1020 | 1.00 | 2.25 | 35.0 | 13, 20 | Batch | 4.52 | 3.6 |
| Z | DE-1020 | 1.25 | 2.75 | 35.0 | 14, 28 | Batch | 4.52 | 3.6 |
| AA | DE-1020 | 1.25 | 2.50 | 35.0 | 13, 47 | Batch | 4.52 | 3.5 |
| BB | DE-1020 | 1.25 | 2.25 | 35.0 | 13, 39 | Batch | 4.53 | 3.5 |
| CC | DE-1020 | 1.25 | 2.00 | 35.0 | 13, 42 | Batch | 4.53 | 3.5 |
| DD | DE-1020 | 1.50 | 2.75 | 35.0 | 13, 16 | Batch | 4.53 | 3.5 |
| EE | DE-1020 | 1.50 | 2.50 | 35.0 | 13, 17 | Batch | 4.53 | 3.5 |
| FF | DE-1020 | 1.50 | 2.25 | 35.0 | 13, 18 | Batch | 4.53 | 2.8 |
| GG | DE-1020 | 1.50 | 2.00 | 35.0 | 12, 58 | Batch | 4.54 | 3.0 |
| HH | DE-1020 | 1.75 | 3.00 | 35.0 | 13, 10 | Batch | 4.53 | 3.5 |
| II | DE-1020 | 1.75 | 2.75 | 35.0 | 13, 05 | Batch | 4.53 | 3.0 |
| JJ | DE-1020 | 0.75 | 2.75 | 35.0 | 13, 27 | Batch | 4.51 | 3.5 |
| KK | DE-1020 | 0.75 | 2.50 | 35.0 | 13, 25 | Batch | 4.51 | 3.5 |
| LL | DE-1020 | 0.75 | 2.25 | 35.0 | 5, 55 | Batch | 4.52 | 3.5 |
| MM | DE-1020 | 0.75 | 2.00 | 35.0 | 5, 52 | Batch | 4.52 | 3.0 |
| NN | DE-1020 | 0.50 | 3.00 | 35.0 | 23, 38 | Batch | 4.51 | 3.5 |
| OO | DE-1020 | 0.50 | 2.75 | 35.0 | 23, 38 | Batch | 4.51 | 3.5 |
| PP | DE-1020 | 0.50 | 2.50 | 35.0 | 22, 53 | Batch | 4.51 | 3.5 |
| QQ | DE-1020 | 0.50 | 2.25 | 35.0 | 22, 54 | Batch | 4.51 | 3.5 |

Example 5

This Example illustrates the difference in conductivity in films prepared from the PEDT/Nafion® dispersions from Example 4. Glass substrates were prepared with patterned ITO electrodes. Buffer layers were spin cast from the dispersions indicated to form films on top of the patterned substrates, and thereafter baked at 90° C. in a vacuum oven for 0.5 hours. The resistance between ITO electrodes was measured using a high resistance electrometer in dry box. Thickness of the film was measured by using a Dec-Tac surface profiler (Alpha-Step 500 Surface Profiler, Tencor Instruments). The conductivity of buffer layer is calculated from the resistance and thickness.

Figure 3:
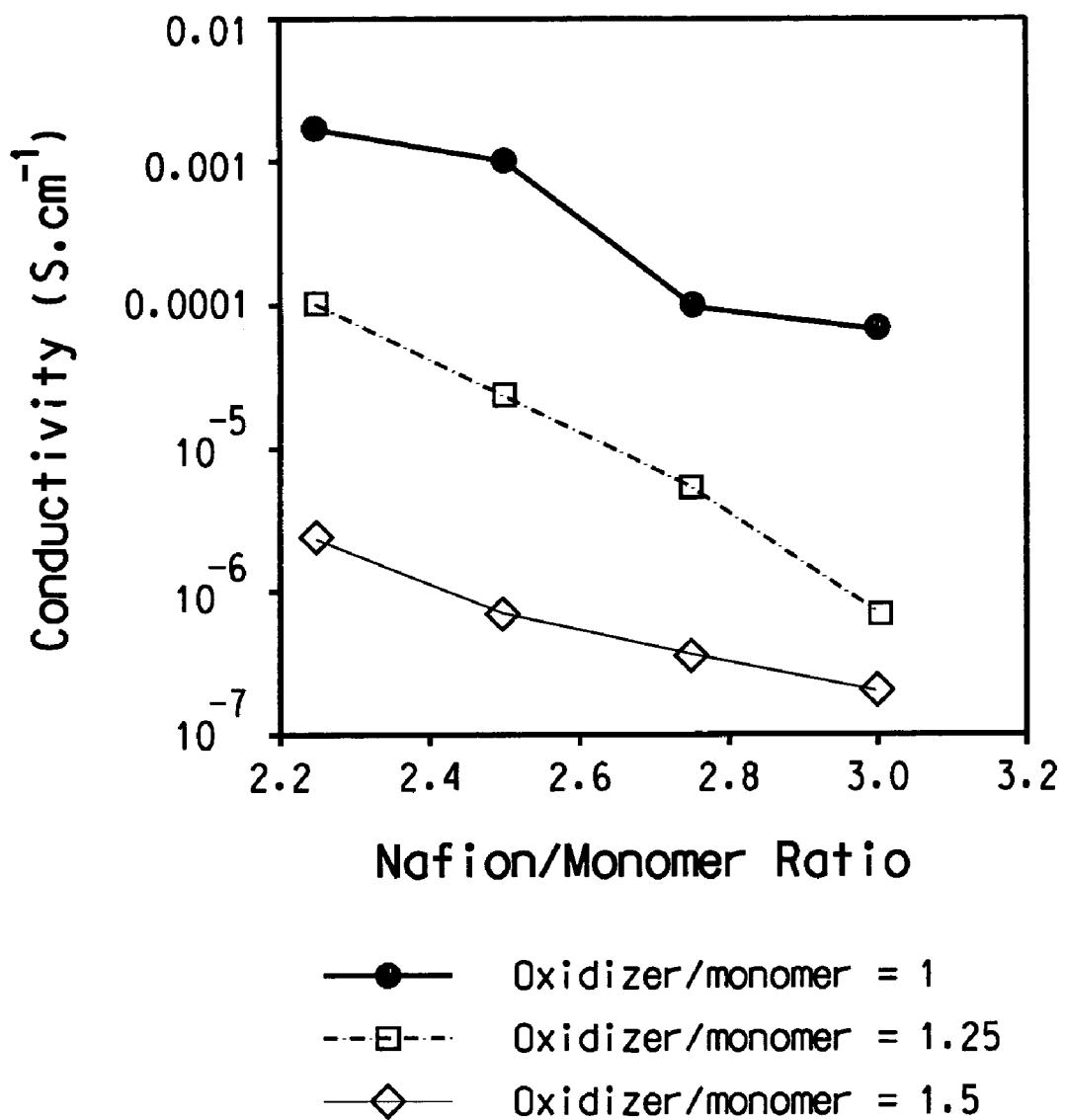
FIG. 3 illustrates the change in conductivity of PEDT/Nafion® films with the ratio of oxidizer to monomer in the polymerization reaction.
Figure 4:
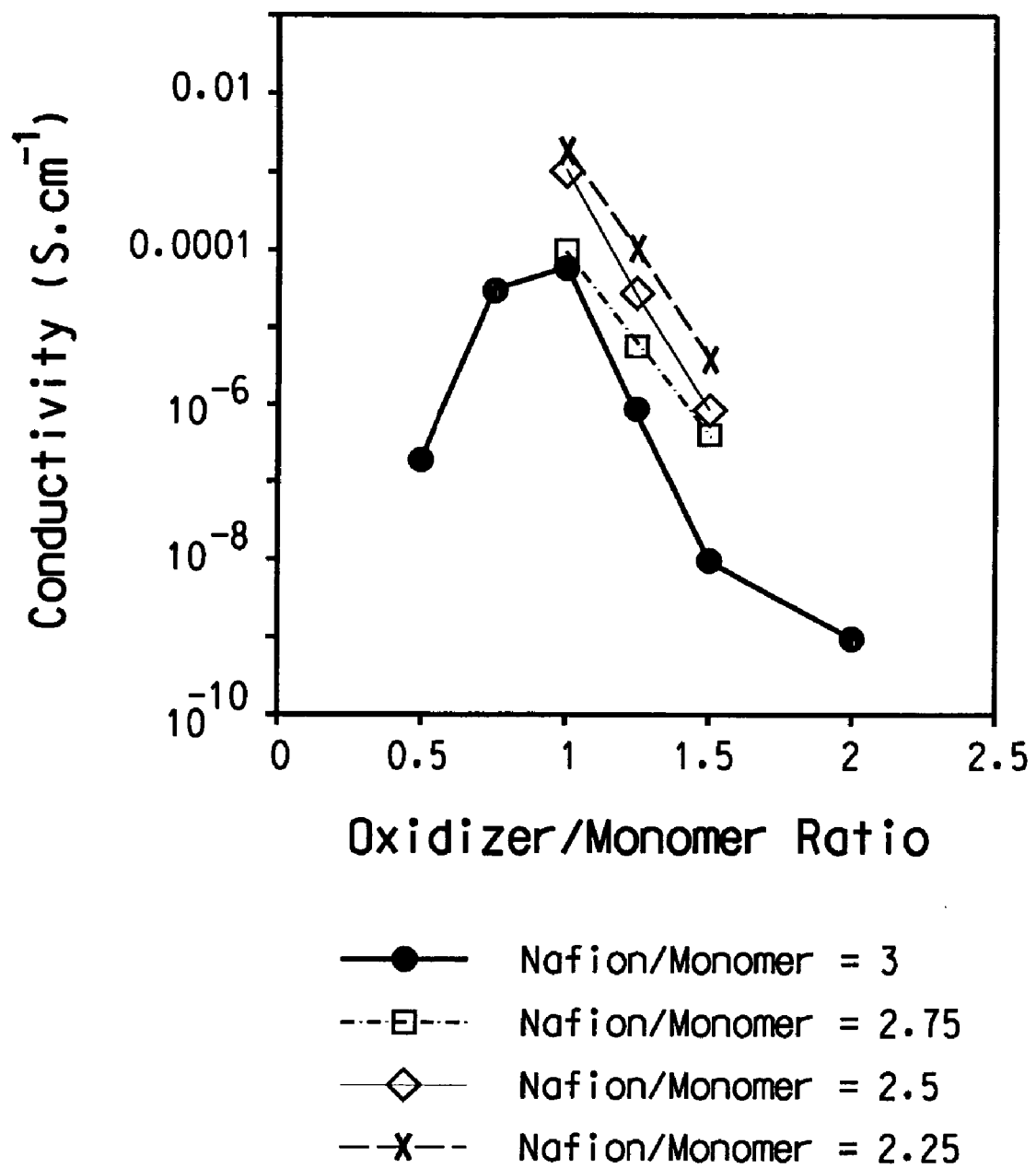
FIG. 4 illustrates the change in conductivity of PEDT/Nafion® films with the ratio of Nafion® to monomer in the polymerization reaction.

The results are shown graphically in FIGS. 3 and 4. It can be seen that the conductivity could be well controlled in the range of $10^{-2}$ S.cm$^{-1}$ to $10^{-9}$ S.cm$^{-1}$ by varying the composition.

Example 6

This Example illustrates the performance of different PEDT/Nafion® compositions used as buffer layers in OLEDs.

Light emitting diodes were fabricated using soluble poly (1,4phenylenevinylene) copolymer (C-PPV) (H. Becker, H. Spreitzer, W. Kreduer, E. Kluge, H. Schenk, I. D. Parker and Y. Cao, Adv. Mater. 12, 42 (2000)) as the active semiconducting, luminescent polymer; the thickness of the C-PPV films were 700-900 Å. C-PPV emits yellow-green light with emission peak at ~560 nm. Indium/tin oxide was used as the anode. PEDT/Nafion® films were spin-cast on top of the patterned substrates from solutions, and thereafter, baked at 90° C. in a vacuum oven for 0.5 hour. The device architecture was ITO/PEDT-Nafion®/C-PPV/metal. Devices were fabricated using ITO on glass as the substrate (Applied ITO/glass). Devices were made with a layer of either Ca or Ba as the cathode. The metal cathode film was fabricated on top of the C-PPV layer using vacuum vapor deposition at pressures below $1 \times 10^{-6}$ Torr yielding an active layer with area of 3 cm$^2$. The deposition was monitored with a STM-100 thickness/rate meter (Sycon Instruments, Inc.). 2,000-5,000 Å of aluminum was deposited on top of the 30 Å of barium or calcium layer. For each of the devices, the current vs. voltage curve, the light vs. voltage curve, and the quantum efficiency were measured.

The devices were encapsulated using a cover glass sandwiched by UV-curable epoxy. The encapsulated devices were run at a constant current in an oven at 80° C. The total current through the device was ~10 mA with luminance of approx. 200 cd/m$^2$ or 600 cd/m$^2$. The luminance and voltage of the devices were recorded to determine the half life time and voltage increase rate at 80° C.

The results are given in Table 2 below.

TABLE 2

| | | | | | | Device Performance | | at 80° C. | |
|---|---|---|---|---|---|---|---|---|---|
| Sample ID | Spin Rate [rpm] | Thick. [Å] | Conductivity [S/cm] | Volt. [V] | Eff. [cd/A] | I.L. [cd/m2] | $t_{1/2}$ [h] | I.L.*$t_{1/2}$ | |
| 4-N | 3000 | 1114 | $1.2 \times 10^{-6}$ | 3.8-3.9 (1) | 7.8-8.8 (1) | 141 | 252 | 35532 | |
| 4-Q | 2000 | 2096 | $6.9 \times 10^{-5}$ | 3.0-3.1 (1) | 8.8-9.7 (1) | 162 | 317 | 51354 | |
| 4-X | 2300 | 1390 | $1.0 \times 10^{-4}$ | 3.5 (2) | 10.6 (2) | 468 | 140 | 65520 | |
| 4-Z | 2000 | 840 | $5.9 \times 10^{-6}$ | 4.6 (2) | 9.3 (2) | 471 | 102 | 48042 | |
| 4-AA | 800 | 1227 | $2.4 \times 10^{-5}$ | 4 (2) | 10 (2) | 449 | 112 | 50288 | |
| Comp. 1 | 1200 | 1400 | $6.1 \times 10^{-3}$ | 5 (1) | 5.4 (1) | | <1 | | |

I.L. = initial luminance
(1) measured at 200 cd/m2
(2) measured at 600 cd/m2

Example 7

This Example illustrates the preparation of an aqueous dispersion of PEDT/Nafion®. The Nafion® was a 12.5% (w/w) aqueous colloidal dispersion with an EW of 990, made using a procedure similar to the procedure in U.S. Pat. 6,150,426, Example 9.

63.87 g (8.06 mmoles of Nafion® monomer units) Nafion® aqueous colloidal dispersion, and 234.47 g deionized water was massed into a 500 mL jacketed three-necked round bottom flask. The mixture was stirred for 45 minutes before the addition of ferric sulfate and sodium persulfate. A stock solution of ferric sulfate was made first by dissolving 0.0141 g ferric sulfate hydrate (97%, Aldrich cat. #30,771-8) with deionized water to a total weight of 3.6363 g. 0.96 g (0.0072 mmoles) of the ferric sulfate solution and 0.85 g (3.57 mmoles) sodium persulfate (Fluka, cat. # 71899) were then placed into the reaction flask while the mixture was being stirred. The mixture was then stirred for 3 minutes prior to addition of 0.312 mL (2.928 mmoles) of Baytron-M (a trade name for 3,4-ethyylenedioxythiophene from Bayer, Pittsburgh, USA) was added to the reaction mixture while stirring. The polymerization was allowed to proceed with stirring at about 20° C. controlled by circulation fluid. The polymerization liquid started to turn blue in 13 minutes. The reaction was terminated in 16.1 hours by adding 8.91 g Lewatit® S100, a trade name from Bayer, Pittsburgh, Pa., for sodium sulfonate of crosslinked polystyrene, and 7.70 g Lewatit® MP62 WS, a trade from Bayer, Pittsburgh, Pa., for free base/chloride of tertiary/quaternary amine of crosslinked polystyrene. The two resins were washed first before use with deionized water separately until there was no color in the water. The resin treatment proceeded for 5 hrs. The resulting slurry was then suction-filtered through a Whatman #54 filter paper. It went through the filter paper very fast. Yield was 244 g. Solid % was about 3.1% (w/w) based on added polymerization ingredients. pH of the aqueous PEDT/Nafion® was determined to be 3.8 with a 315 pH/Ion meter from Corning Company (Corning, N.Y., USA).

Example 8

This example illustrates the non-dispersibility of dried films of PEDT/Nafion®.

About 10 mL of the aqueous PEDT/Nafion® dispersion prepared in Example 7 was dried with a nitrogen stream at ambient temperature. The dried PEDT/Nafion® was mixed with 10 mL deionized water. The water remained colorless and clear for many months.

Example 9

This example illustrates the non-corrosiveness of the aqueous PEDT/Nafion® dispersion to ITO.

The aqueous PEDT/Nafion® prepared in Example 7 was used to spin-coat on an ITO substrate. The PEDT/Nafion® top surface was examined using X-ray photoelectron spectroscopy (XPS). There was no indium or tin element detected, indicating that the ITO was not attacked by the aqueous PEDT/Nafion® dispersion, which had a pH of 3.8.

Comparative Example 4

This comparative example illustrates the re-dispersibility of dried Baytron-P and its corrosiveness to ITO.

CH8000, one of the OLED grades of Baytron-P from H. C. Starck, GmbH (Leverkusen, Germany), is an aqueous poly(3,4dioxyethylenethiophene), PEDT, made with polystyrenesulfonic acid (PSSA). The ratio of PEDT to PSSA and polystyrenesulfonate (PSS) is 1:20 (w/w). PEDT/PSS/PSSA has a pH in the range of 1. PEDT/PSS/PSSA dried at ambient conditions from the aqueous dispersion re-dispersed in water very readily. The PEDT/PSS/PSSA was coated onto ITO as in Example 9. The top surface was examined using X-ray photoelectron spectroscopy (XPS). Both indium and tin elements were detected, indicating that ITO was attacked by the aqueous PEDT/PSSA/PSS dispersion, which had a pH of ~1.

Examples 10-12

These examples illustrate the use of PEDT/Nafion® in multilayer coatings.

Example 10

This example illustrates the formation of thicker layers by using multiple layer coatings of aqueous PEDT/Nafion®.

An aqueous PEDT/Nafion® dispersion prepared in an identical manner as in Example 7, was spin-coated three times consecutively at a spin speed of 800 rpm. Between each spin coating, the cast film was baked at 90® C. in vacuo. Thickness was taken with a Tencor profilometer, average of two measurements.

1st layer=99 nm after bake.

2nd layer (total thickness)=203 nm after bake.

3rd layer (total thickness)=322 nm after bake.

The thickness data clearly illustrates that each deposition has a thickness of about 100 nm. Moreover, the data also shows that dried PEDT/Nafion® films are not re-dispersible in water.

Example 11

This example illustrates the use of PEDT/Nafion® in an OLED with two buffer layers, where the PEDT/Nafion® is in contact with the ITO anode.

Two aqueous PEDT dispersions were used for construction of double buffer layers for light emission tests. One is CH8000 (lot # KIM4952) described in Comparative Example 4. The other is aqueous PEDT/Nafion® described in Example 7. The glass/ITO substrates (30 mm×30 mm) having ITO thickness of 100 to150 nm and 15 mm×20 mm ITO area for light emission were cleaned and subsequently treated with oxygen plasma. The aqueous PEDT/Nafion® dispersion was spin-coated onto the ITO/glass substrates first and subsequently baked at 90° C. for 30 minutes in vacuo. The PEDT/Nafion® layer was then top-coated with CH8000 and subsequently baked at 90° C. for 30 minutes in vacuo. The total thickness of double layers is 86 nm. The double buffer layers were then top-coated with a xylene solution (1.2% w/w) of BP-79 (Dow Chemical, blue light emitting polymer). Thickness of the BP-79 layer is 70 nm. The BP-79 layer was then vapor-deposited with LiF, Ca and finally aluminum under a vacuum of $1 \times 10^{-6}$ torr with respective thickness of 2 nm, 20 nm and 500 nm. The devices made from the double layer construction have an initial efficiency of 2.9 to 3.5 Cd/A and initial operating voltage of 3.8 to 3.9 volt. Half-life of the devices at room temperature is 307 hours.

This illustrates the utility of PEDT/Nafion® as a passivation layer for ITO.

Example 12

This Example illustrates the use of PEDT/Nafion® in an OLED with two buffer layers, where the PEDT/Nafion® is in contact with the EL layer.

CH8000 (lot# KIM4952) was spin-coated onto the ITO/glass substrates described in Example 11, and subsequently baked at 200° C. for 3 minutes on hotplate in air. The thickness of the layer was 85 nm. The CH8000 layer was then top-coated with the aqueous PEDT/Nafion® and subsequently baked at 90° C. for 30 minutes in vacuo. The thickness of the PEDT/Nafion® layer was 21 nm. The double buffer layers were then top-coated with a xylene solution (1.2% w/w) of BP-79 (Dow Chemical, blue light emitting polymer). The thickness of the BP-79 layer was 70 nm. The BP-79 layer was then vapor-deposited with LiF, Ca and finally aluminum under a vacuum of $1 \times 10^{-6}$ torr with respective thicknesses of 2 nm, 20 nm and 500 nm. The devices made from the double layer construction had an initial efficiency of 2.5 to 3.1 Cd/A and an initial operating voltage of 4.1 to 4.2 volt. The half-life of the devices at room temperature was 54 hours. This is similar to the lifetime of devices made with CH8000 alone and much less than the half-life described in Example 11. The comparison illustrates the passivation function of PEDT/Nafion® in contact with the ITO substrates.

Example 13

This Example illustrates the improved operating lifetime of OLED devices using a PEDT/Nafion® buffer layer and a green light-emitting polymer.

OLED devices were fabricated as follows: 30 mm×30 mm glass substrates having a 15 mm×20 mm ITO area were cleaned with solvents and oxygen plasma. The ITO layer was 100-150 nm thick. The aqueous PEDT/Nafion® dispersion was spin-coated, in air, onto the ITO/glass substrates and baked at 90° C. for 30 minutes in vacuum. The dried film thickness was in the range 50-100 nm. These substrates were then transferred into a nitrogen filled dry box with oxygen and water levels ~1 ppm. The light-emitting polymer, DOW Green K2 (Dow Chemical Co., Midland, Mich.), was spin-coated on top of the PEDT/Nafion® layer. The DOW K2 solution was ~1% solids in a xylene solvent. The films were then baked a second time at 130° C. for 5 minutes in the dry-box. Thickness of the K2 layer was ~75 nm. These substrates were then transferred into a thermal evaporator and cathode deposited under a vacuum of approx. $1 \times 10^{-6}$ torr. The cathode consisted of ~5 nm Ba followed by ~0.5 micron of Al. Finally these devices were removed from the dry-box and hermetically sealed prior to operational lifetime testing in an environmental chamber. The operating-lifetime testing conditions for these displays were: Initial luminance 200 cd/m2, DC constant current, testing temperature of 80° C. (in order to accelerate the testing process).

Figure 5:
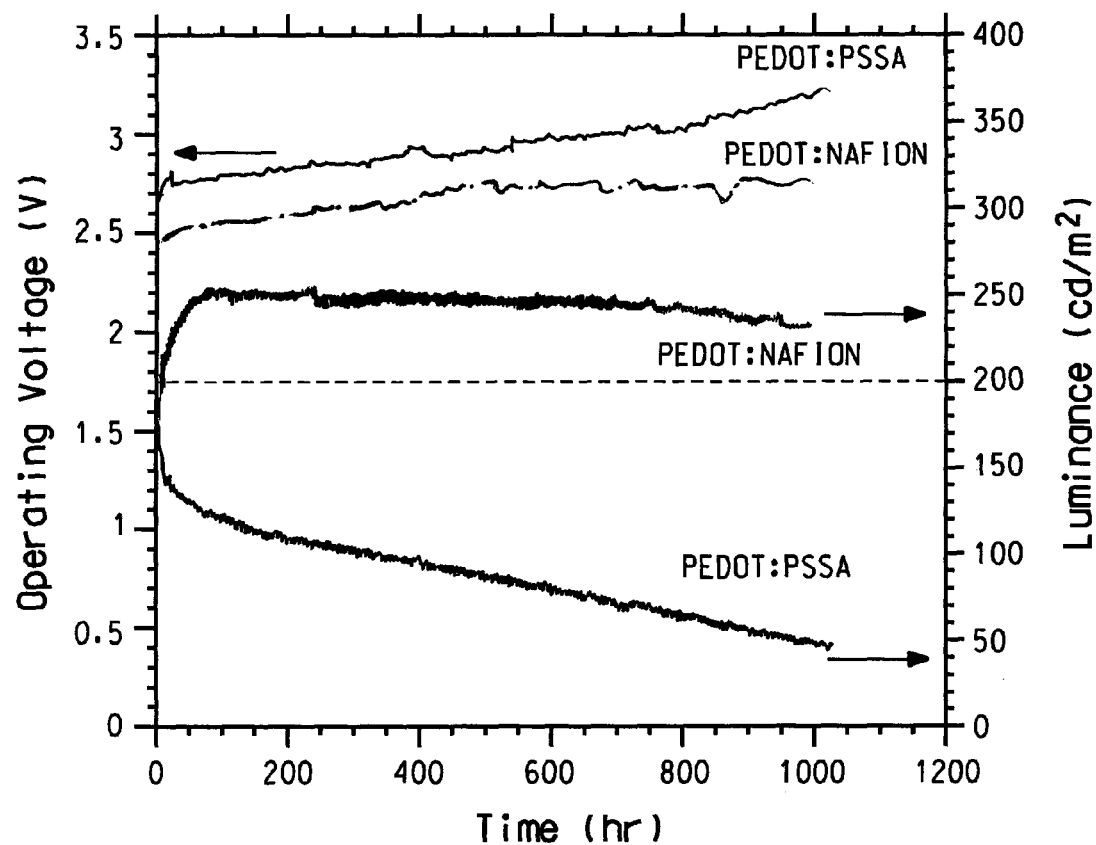
FIG. 5 illustrates the operation lifetime of OLED devices with green light-emitting polymers.

The results are shown grahically in FIG. 5. The estimated lifetime for the displays with PEDT/Nafion® was approximately 10× longer than for the display with PEDT/PSSA. The initial operating voltage was ~10% lower for PEDT/Nafion®. In addition, the voltage increase rate was ~25% lower.

Example 14

This Example illustrates the improved operating lifetime of OLED devices using a PEDT/Nafion® buffer layer and a red light-emitting polymer.

OLED devices were fabricated as follows: 30 mm×30 mm glass substrates having a 15 mm×20 mm ITO area were cleaned with solvents and oxygen plasma. The ITO layer is 100-150 nm thick. The aqueous PEDT/Nafion® dispersion was spin-coated, in air, onto the ITO/glass substrates and baked at 90° C. for 30 minutes in vacuum. The dried film thickness was in the range 50-100 nm. These substrates were then transferred into a nitrogen filled dry box with oxygen and water levels ~1 ppm. The light-emitting polymer, AEF 2157 (Covion GmbH, Frankfurt, Germany), was spin-coated on top of the PEDT/Nafion® layer. The AEF 2157 solution was ~1% solids in a toluene solvent. The films were then baked a second time at 130° C. for 5 minutes in the dry-box. Thickness of the AEF 2157 layer was ~75 nm. These substrates were then transferred into a thermal evaporator and cathode deposited under a vacuum of approx. $1 \times 10^{-6}$ torr. The cathode consisted of ~5 nm Ba followed by ~0.5 micron of Al. Finally these devices were removed from the dry-box and hermetically sealed prior to operational lifetime testing in an environmental chamber. The operating lifetime testing conditions for these displays were: Initial luminance 170 cd/m2, DC constant current, testing temperature of 80° C. (in order to accelerate the testing process).

Figure 6:
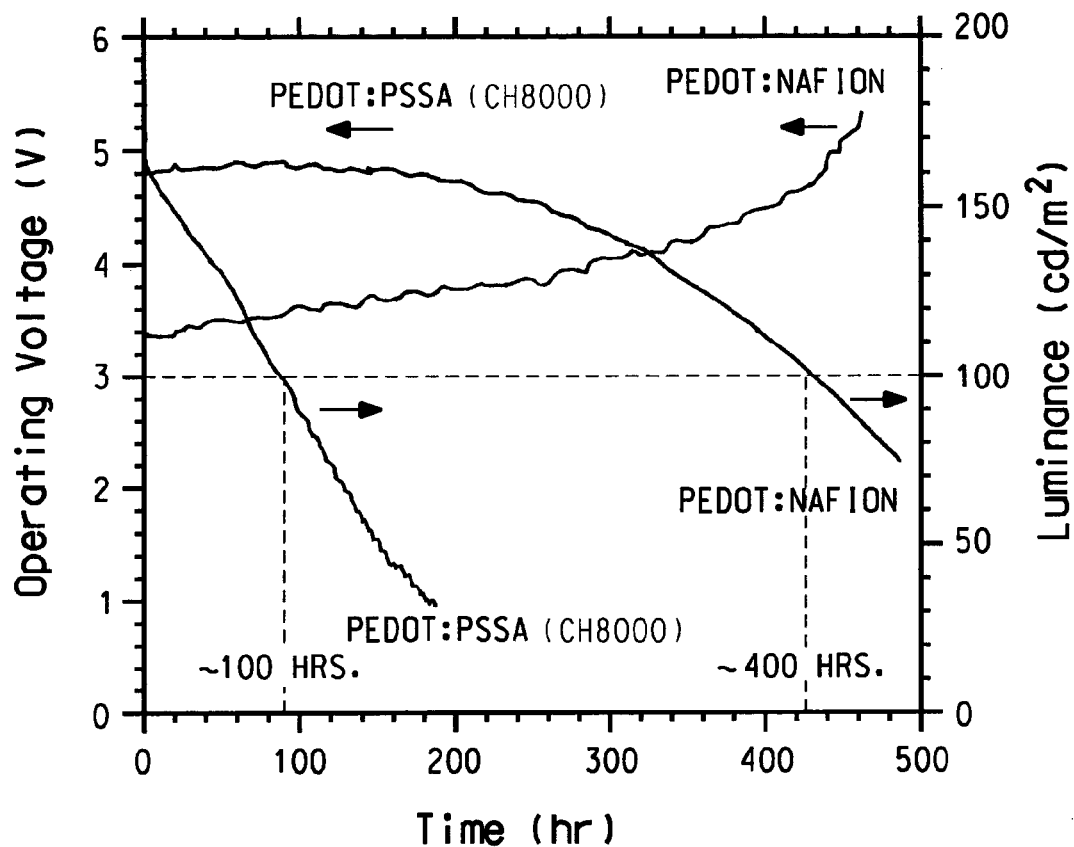
FIG. 6 illustrates the operation lifetime of OLED devices with red light-emitting polymers.

The results are shown graphically in FIG. 6. The estimated lifetime for the displays with PEDT/Nafion® was approximately 4× longer than for the display with PEDT/PSSA. The initial operating voltage was ~20% lower for PEDT/Nafion®. Also, the voltage increase rate was >3× lower.

Example 15

This Example illustrates the improved operating lifetime of OLED devices using a PEDT/Nafion® buffer layer and a blue light-emitting polymer.

OLED devices were fabricated as follows: 30 mm×30 mm glass substrates having a 15 mm×20 mm ITO area were cleaned with solvents and oxygen plasma. The ITO layer is 100-150 nm thick. The aqueous PEDT/Nafion® dispersion was spin-coated, in air, onto the ITO/glass substrates and baked at 90° C. for 30 minutes in vacuum. The dried film thickness was in the range 50-100 nm. These substrates were then transferred into a nitrogen filled dry box with oxygen and water levels ~1 ppm. The light-emitting polymer, SCB-11 (Dow Chemical Co., Midland, Mich.), was spin-coated on top of the PEDT/Nafion® layer. The SCB-11 solution was ~1% solids in a xylene solvent. The films were then baked a second time at 130° C. for 5 minutes in the dry-box. Thickness of the SCB-11 layer was ~75 nm. These substrates were then transferred into a thermal evaporator and cathode deposited under a vacuum of approx. $1\times10^{-6}$ torr. The cathode consisted of ~2 nm LiF, followed by 20 nm of Ca, and then ~0.5 micron of Al. Finally these devices were removed from the dry-box and hermetically sealed prior to operational lifetime testing in an environmental chamber. The operating lifetime testing conditions for these displays were: Initial luminance 170 cd/m2, DC constant current, testing temperature of 80° C. (in order to accelerate the testing process).

Figure 7:
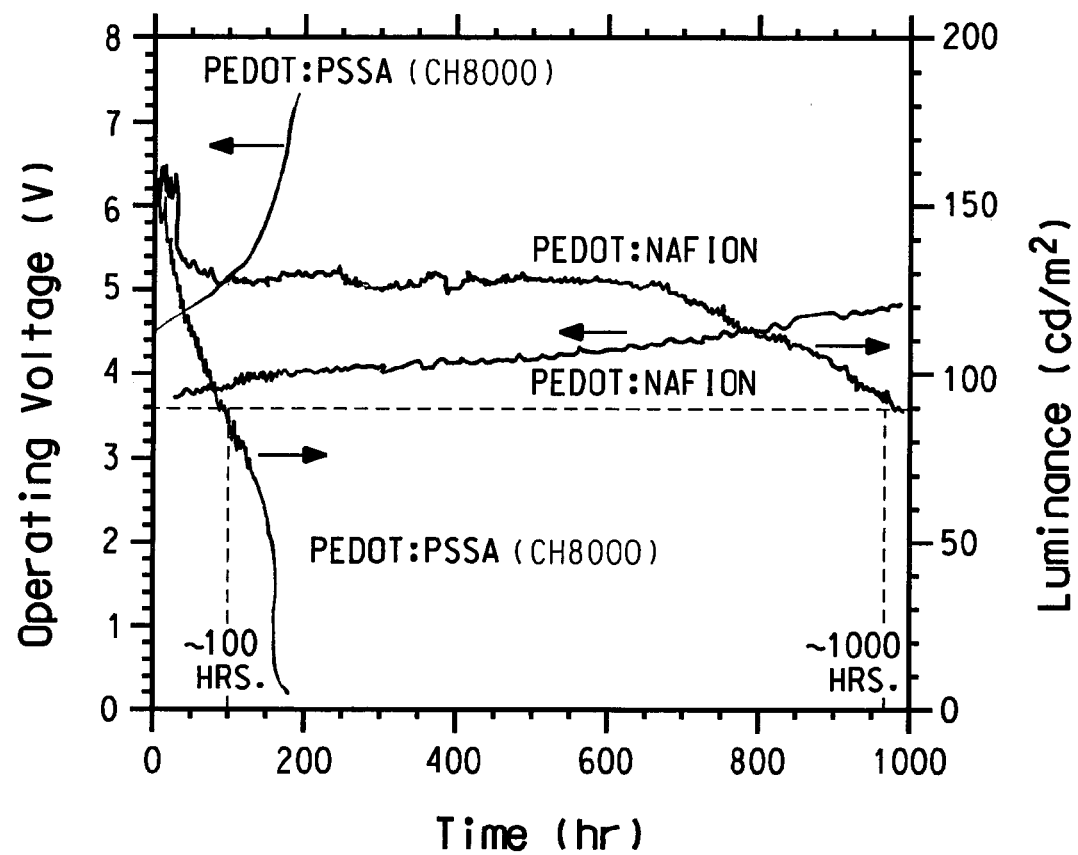
FIG. 7 illustrates the operation lifetime of OLED devices with blue light-emitting polymers.

The results are shown graphically in FIG. 7. The estimated lifetime for the displays with PEDT/Nafion® was approximately 10× longer than for the display with PEDT/PSSA. The initial operating voltage was ~20% lower for PEDT/Nafion®. Also, the voltage increase rate was more than 6× lower.

Examples 16-21

These Examples illustrate the effect of pH on different PEDT buffer layers.

Example 16

This Example illustrates the preparation of PEDT/Nafion®. The Nafion® was a 12.5% (w/w) aqueous colloidal dispersion with an EW of 1050, made using a procedure similar to the procedure in U.S. Pat. 6,150,426, Example 9.

150.90 g (17.25 mmoles of Nafion® monomer units) Nafion® (1050 EW) aqueous colloidal dispersion (12.%, w/w) and 235.11 g deionized water was massed into a 500 mL Nalgene® plastic bottle, which was then rolled for about two hours. The diluted colloidal dispersion was then transferred to a 500 mL jacketed three-necked round bottom flask. Due to a small loss of the dispersion in the transfer, only 146.18 g Nafion® was transferred, which amounted to 16.71 mmoles Nafion® in the reaction flask. A stock solution of ferric sulfate was made first by dissolving 0.0339 g ferric sulfate hydrate (97%, Aldrich cat. #30,771-8) with deionized water to a total weight of 3.285 g. 1.50 g (0.0315 mmoles) of the ferric sulfate solution and 1.76 g (7.392 mmoles) sodium persulfate (Fluka, cat. #71899) were then placed into the reaction flask while the mixture was being stirred. The mixture was then stirred for 5 minutes prior to addition of 0.647 mL (6.071 mmoles) of Baytron-M while stirring. The polymerization was allowed to proceed with stirring at about 20° C. controlled by circulation fluid. The polymerization liquid started to turn blue in 5 minutes. The reaction was terminated in 3.2 hours by adding 20.99 g Lewatit® S100 and 20.44 g Lewatit® MP62 WS, as in Example 7. The two resins were washed first before use with deionized water separately until there was no color in the water. The resin treatment was preceded for 21 hrs. The resulting slurry was then suction-filtered through a Whatman #54 filter paper. Filtration was fairly easy. Solid % was about 4.89% (w/w) based on added polymerization ingredients.

255.6 g of the PEDT/Nafion® was added with deionized water to a total weight of 480.8 g, to make 2.6% solid (w/w). The pH of the diluted aqueous PEDT/Nafion® was determined to be 3.9 with a 315 pH/Ion meter from Corning Company (Corning, N.Y., USA).

Example 17

This example illustrates the preparation of a PEDT/Nafion® dispersion with a pH of 2.2.

The diluted PEDT/Nafion® prepared in Example 16 was used as a starting material. 3.07 g Dowex 550A resin (Aldrich Cat. # 43,660-7), a strong base anion exchange resin, was added and left stirring for 1.2 hrs. The Dowex 550A was washed first before use with deionized water until there was no color in the water. The mixture was filtered and the filtrate was added with 3.0 g Amberlyst 15 (Aldrich Cat # 21,639,9, proton cation exchange resin.) and left stirred for 45 minutes and filtered. The filtrate was added with 3.0 g of fresh Amberlyst 15 and left stirred 15 hours and filtered for OLED testing. Amberlyst 15 was washed first before use with deionized water several times. The pH of Amberlyst 15 treated aqueous PEDT/Nafion® was determined to be 2.2.

Example 18

This example illustrates the preparation of a PEDT/Nafion® dispersion with a pH of 4.3

A batch of PEDT/Nafion® was prepared in the same manner as in Example 16. 61.02 g of the as-prepared dispersion was diluted to 2.8% (w/w) with 45.05 g deionized water. The diluted dispersion had a pH of 4.3.

Example 19

This example illustrates the preparation of a PEDT/Nafion® dispersion with a pH of 7.0 using lithium salts.

A dispersion of PEDT/Nafion®, neutralized with lithium ions is described below. This is a two step process: first residual metal ions left over from the synthesis are removed by exchanging them with protons; then a second ion exchange is used to exchange these protons with lithium ions. This gives a dispersion of high purity.

The diluted PEDT/Nafion® as described in Example 16 was first treated with 5.13 g Dowex 550A resin (Aldrich Cat. # 43,660-7), a strong base anion exchange resin, and left stirring for 2 hrs. The Dowex 550A was washed first before use with deionized water until there was no color in the water. The mixture was filtered and the filtrate was treated with 4.13 g Amberlyst 15 (Aldrich Cat # 21,639,9, proton cation exchange resin.) and left stirring for 10 hrs and filtered. Then 3.14 g of fresh Amberlyst 15 was added and left stirring for 1.5 hrs. Finally the dispersion was filtered.

37.82 g of the acidified PEDT/Nafion® was then treated with 1.99 g, 2.33 g, 2.06 g, 2.08 g and 2.00 g lithium salt of Amberlyst 15. Between replacements of each fresh lithium salt of Amberlyst 15, the mixture was filtered. Also, the mixture was stirred between each filtration and the total resin treatment time was 7 hours. The pH of the treated Nafion® was determined to be 7.0.

Example 20

This example illustrates the preparation of a PEDT/Nafion® dispersion with a pH of 7.2 using Sodium salts.

A dispersion of PEDT/Nafion®, neutralized with sodium ions is described. The starting material is the lithium ion dispersion described in example 16. Further treatment exchanges the lithium ions for sodium ions as described below. This gives a dispersion of high purity.

The diluted PEDT Nafion® as described in Example 16 was first treated with 2.76 g, 3.57 g, 3.55 g, and 3.25 g Lewatit® e S100. Between replacement of each fresh resin, the mixture was filtered. Also, the mixture was stirred between each filtration and the total resin treatment time was 7 hours. The pH of the treated Nafion® was determined to be 7.2.

Comparative Example 5

This Comparative Example illustrates the preparation of PEDT/PSSA dispersions with modified pH values.

Sample Comp. 5-A

PEDT/PSSA (Al4083, an OLED grade of Baytron-P from H. C. Starck GmbH Leverkusen, Germany) has a pH of 1.8.

Sample Comp. 5-B 58.9 g of deionized Al4083 (purchased from H. C. Starck, as deionized Al4083) was added with a total amount of 10 grams of lithium salt of Amberlyst 15 in 24 hours. The mixture was stirred during the entire time. The mixture was filtered and the pH of the collected filtrate was determined to be 3.2.

Sample Comp. 5-C 58.18 g of deionized Al4083 was added with a total amount of 14 grams of barium salt of Amberlyst 15 in about 18 hours. The mixture was stirred during the entire time. The mixture was filtered and pH of the collected filtrate was determined to be 3.4.

Sample Comp. 5-D

Deionized Al4083, which should be free of sodium, purchased from from H. C. Starck GmbH was used for conversion to the tetra-butyl ammonium salt. 50.96 g of the deionized Al4083 was added with a total amount of about 9 grams of the tetra-butyl ammonium salt of Amberlyst 15 in 20 hours. The mixture was stirred during the entire time. The mixture was filtered and the pH of the collected filtrate was determined to be 4.3.

Similarly, samples of Al4083 were treated with lithium and cesium ion-exchange resins to result in two additional series of samples with pH values greater than 1.8.

Example 21

This example illustrates the performance of OLEDs made with buffer layers made from the dispersions of Examples 16-21 and Comparative Example 5.

The devices were made in a manner similar to that described in Example 6.

The following EL polymers were used:

| Name | Polymer Type | Manufacturer |
| --- | --- | --- |
| Super Yellow | PPV | Covion |
| Blue BP79 | Polyfluorene | Dow |
| Green K2 | Polyfluorene | Dow |
| AEF 2198 | Polyspiro | Covion | where "polyspiro" refers to a polymeric spiro-bifluorene.

Figure 8A:
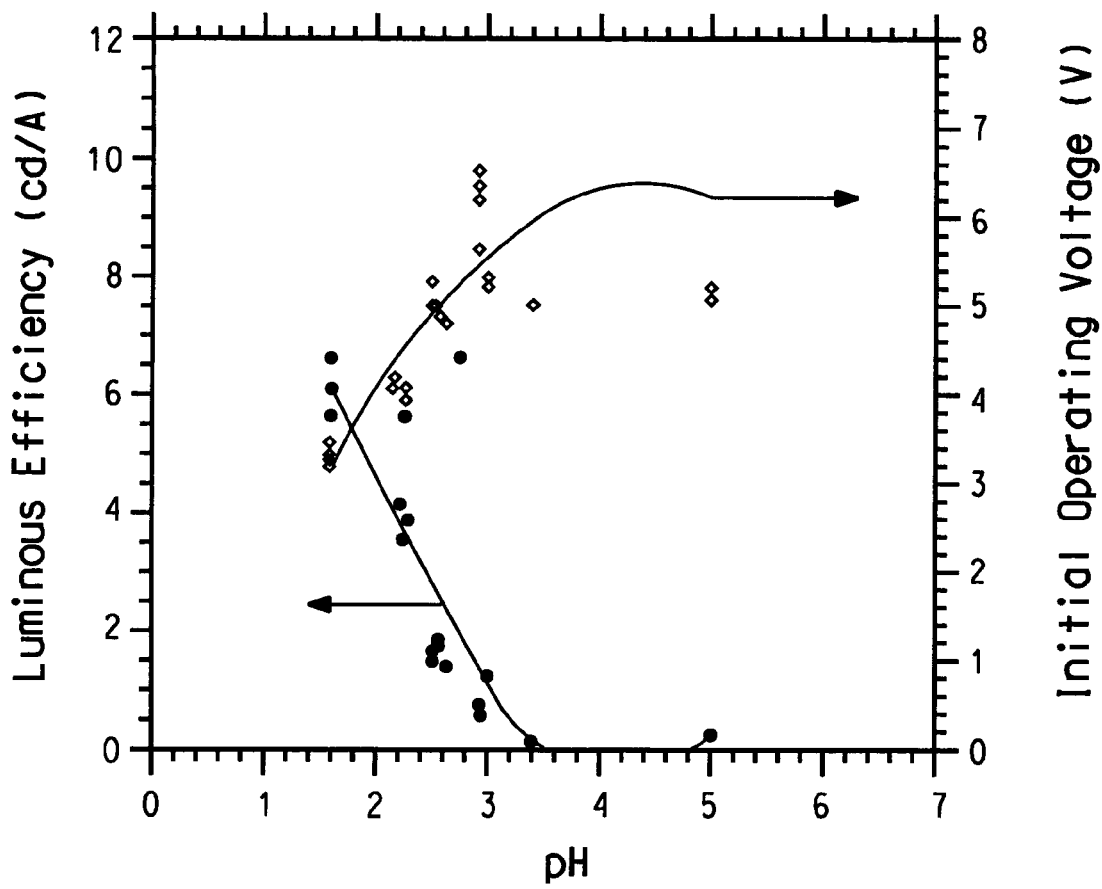
FIG. 8(a) through FIG. 8(d) illustrate the effect of the pH of the PEDT/PSSA buffer layer on OLED device performance.
Figure 8B:
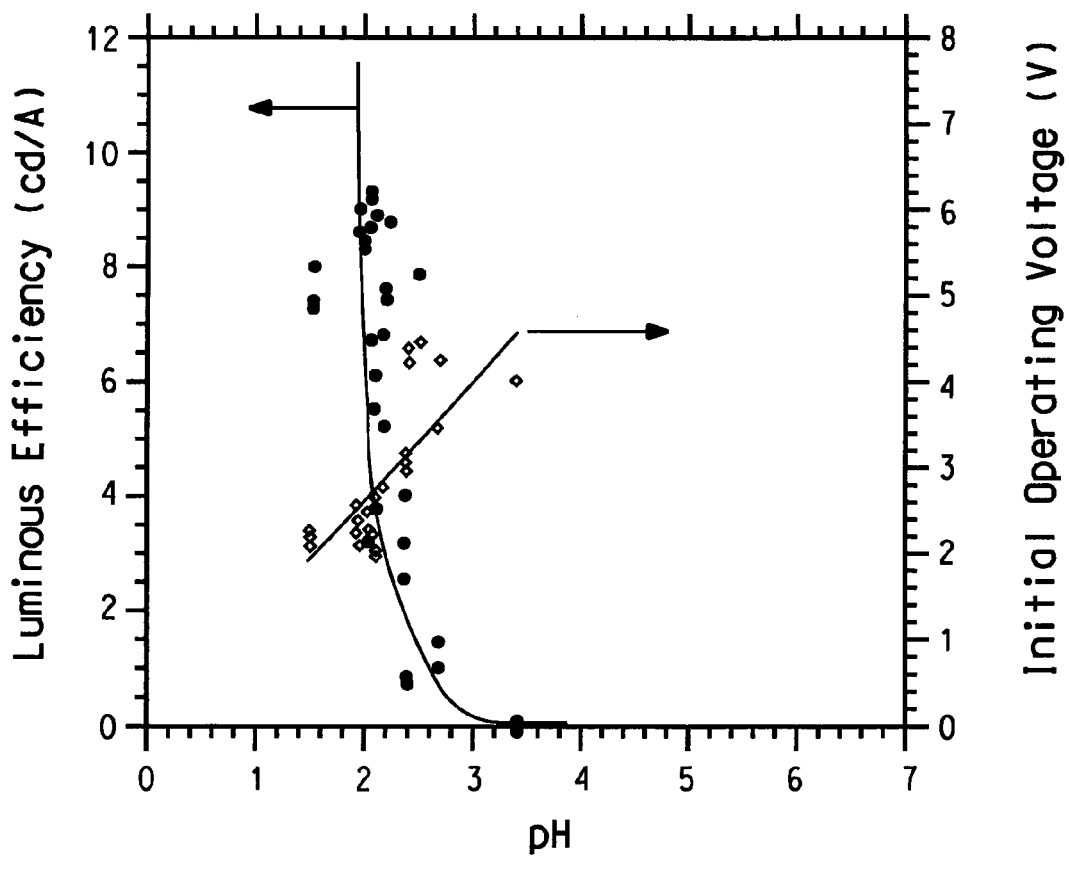
Figure 8C:
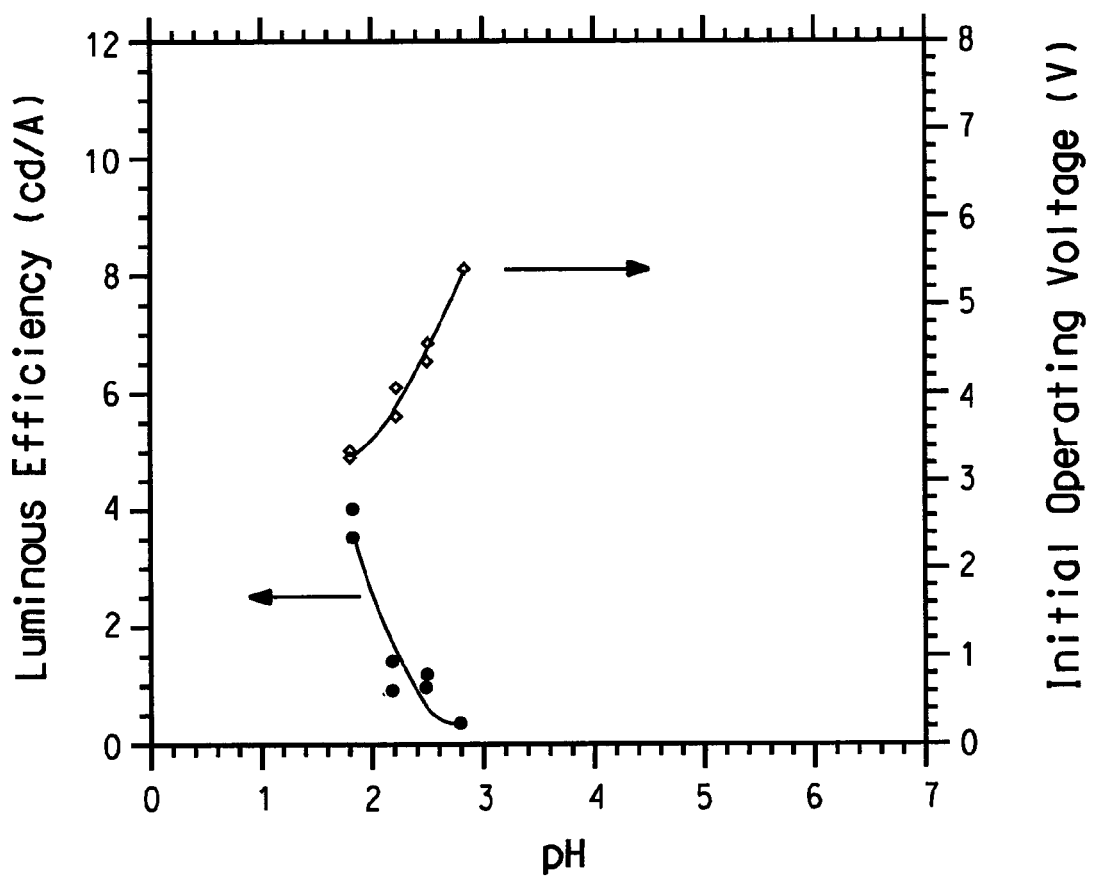
Figure 8D:
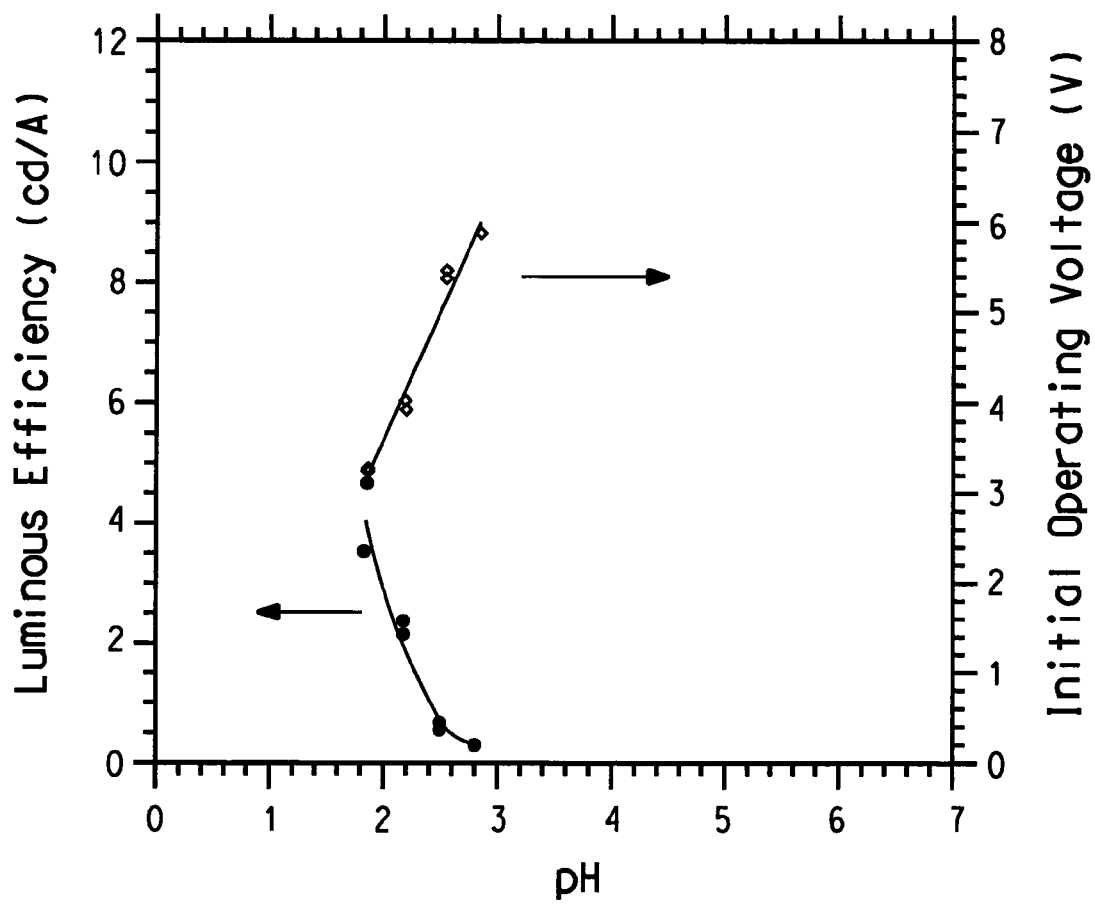

FIGS. 8(a) through 8(c) show the initial device performance of PLEDs that contain a PEDT/PSSA buffer layer, that has had its pH adjusted. Clearly, increasing the pH of Baytron-P much above 2.5 significantly degrades the performance of OLED devices. FIGS. 8(a) and 8(b) compare Baytron-P Al 4071, and Baytron-P 4083, two similar products but with differing electrical conductivity. They have both had their pH adjusted using a sodium ion-exchange resin. FIGS. 8(c) and 8(d) show that lithium and cesium ion-exchange resins, respectively, cause the same phenomenon to occur.

Figure 9A:
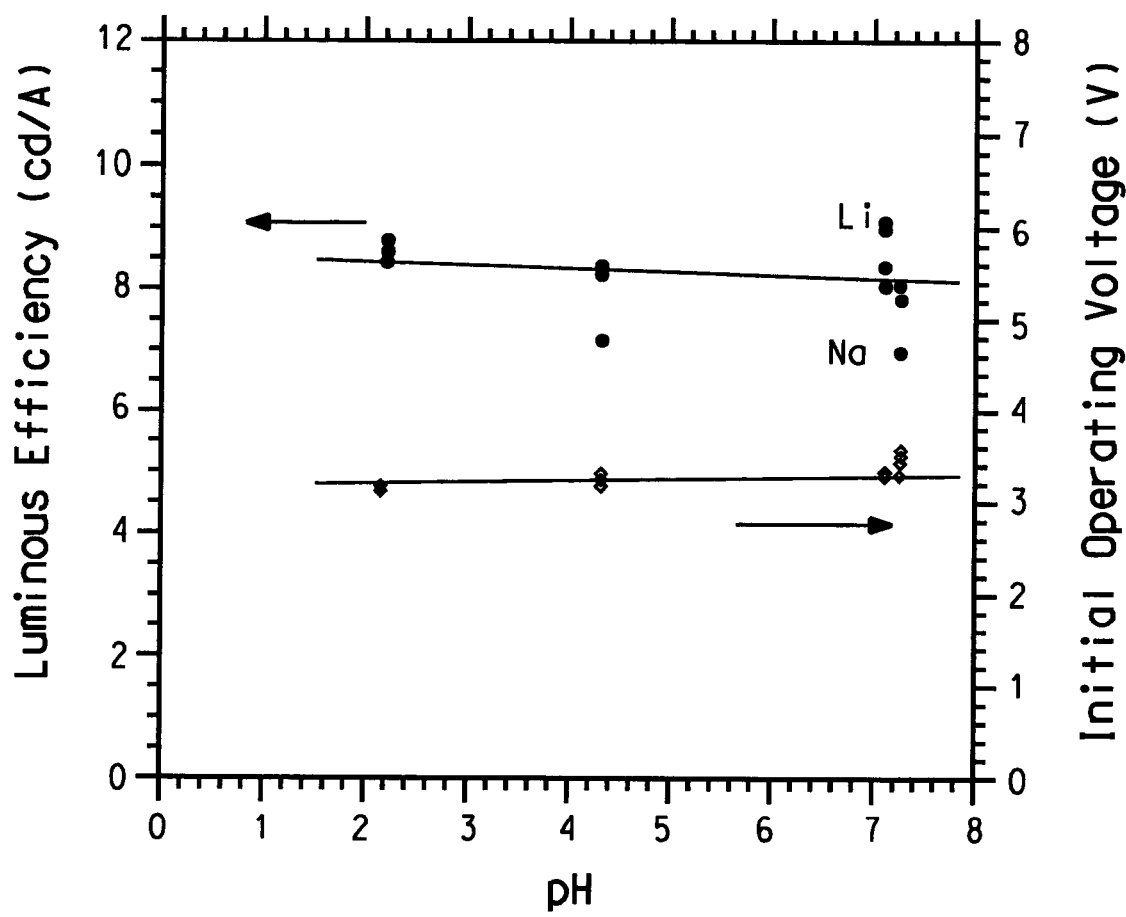
FIG. 9(a) through FIG. 9(c) illustrate the effect of the pH of the PEDT/Nafion® buffer layer on OLED device performance.
Figure 9B:
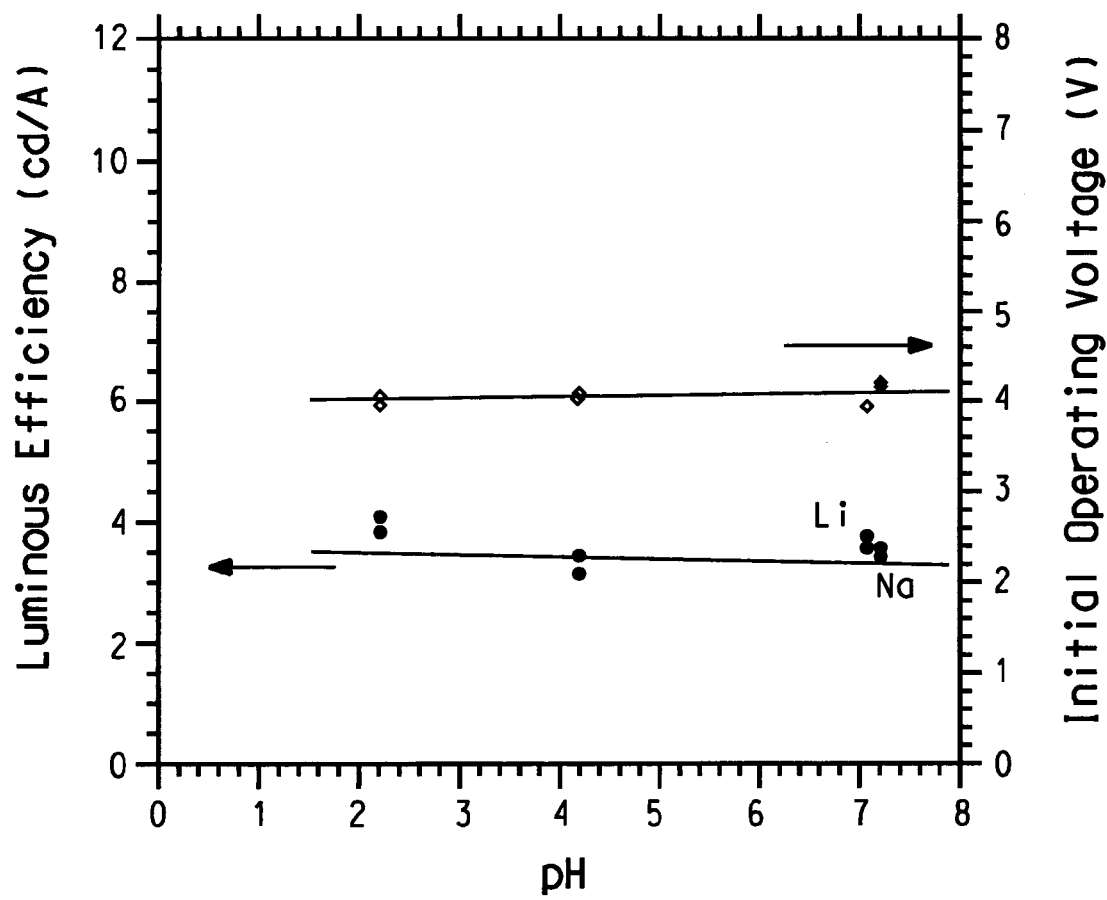
Figure 9C:
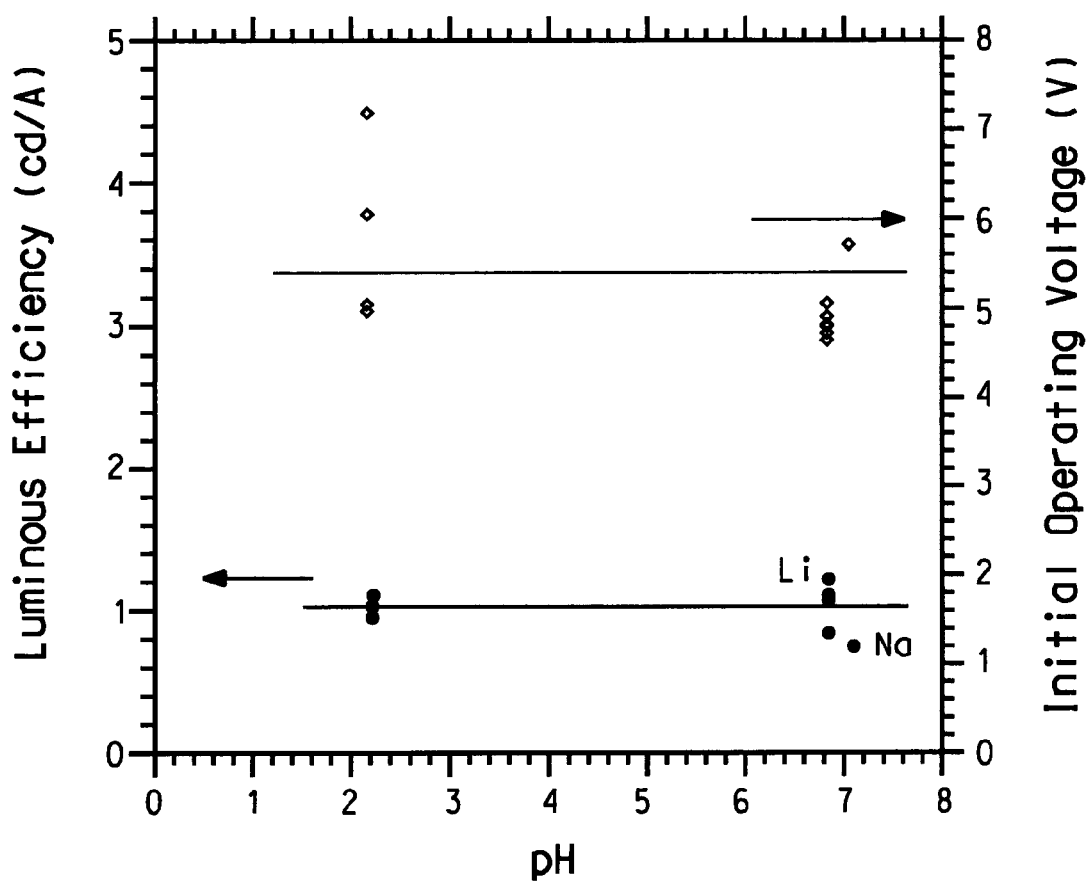

FIGS. 9(a) through 9(c) show the initial device performance of OLEDs that contain a PEDT/Nafion® buffer layer, that has had its pH adjusted. Unlike the devices containing PEDT/PSSA, these devices are not degraded by a pH neutral buffer layer.

In order to assess operational lifetime, the devices were operated with a constant DC current to give an initial luminance of 200 cd/m$^2$, and placed in an oven at 80° C. in order to accelerate their degradation. The devices were constantly monitored for changes in their light-output and operating voltage. Operating lifetime was defined as the time for the luminance to drop to half of its original value (i.e. to 100 cd/m$^2$). The results are given in Table 3 below.

TABLE 3

Device Operating Lifetime

| Buffer Layer | EL Polymer | Lifetime in Hours pH of Buffer Layer | | | | |
| --- | --- | --- | --- | --- | --- | --- |
| | | 1.8-2.0 | 3.2 | 3.4 | 3.8-4.3 | 6.8-7.0 |
| PEDT/Nafion | Super Yellow | 200-250 | | | | 200-240 |
| PEDT/Nafion | Green K2 | 900-1100 | | | 900-1100 | 900-1100 |
| PEDT/Nafion | AEF2198 | 300-400 | | | 400 | |
| PEDT/PSSA | Super Yellow | 200-250 | 46 | 4 | ** | ** |
| PEDT/PSSA | Green K2 | 400 | | | ** | ** |

** indicates that the device does not light

Clearly the PEDT/PSSA devices give good lifetime only for a narrow pH range (pH<~2.5), whereas the PEDT/Nafion® devices can operate over a much wider pH range (at least pH 1.8-7.0).

Example 22

This example illustrates that PEDT/Nafion® does not etch ITO contacts.

Figure 10:
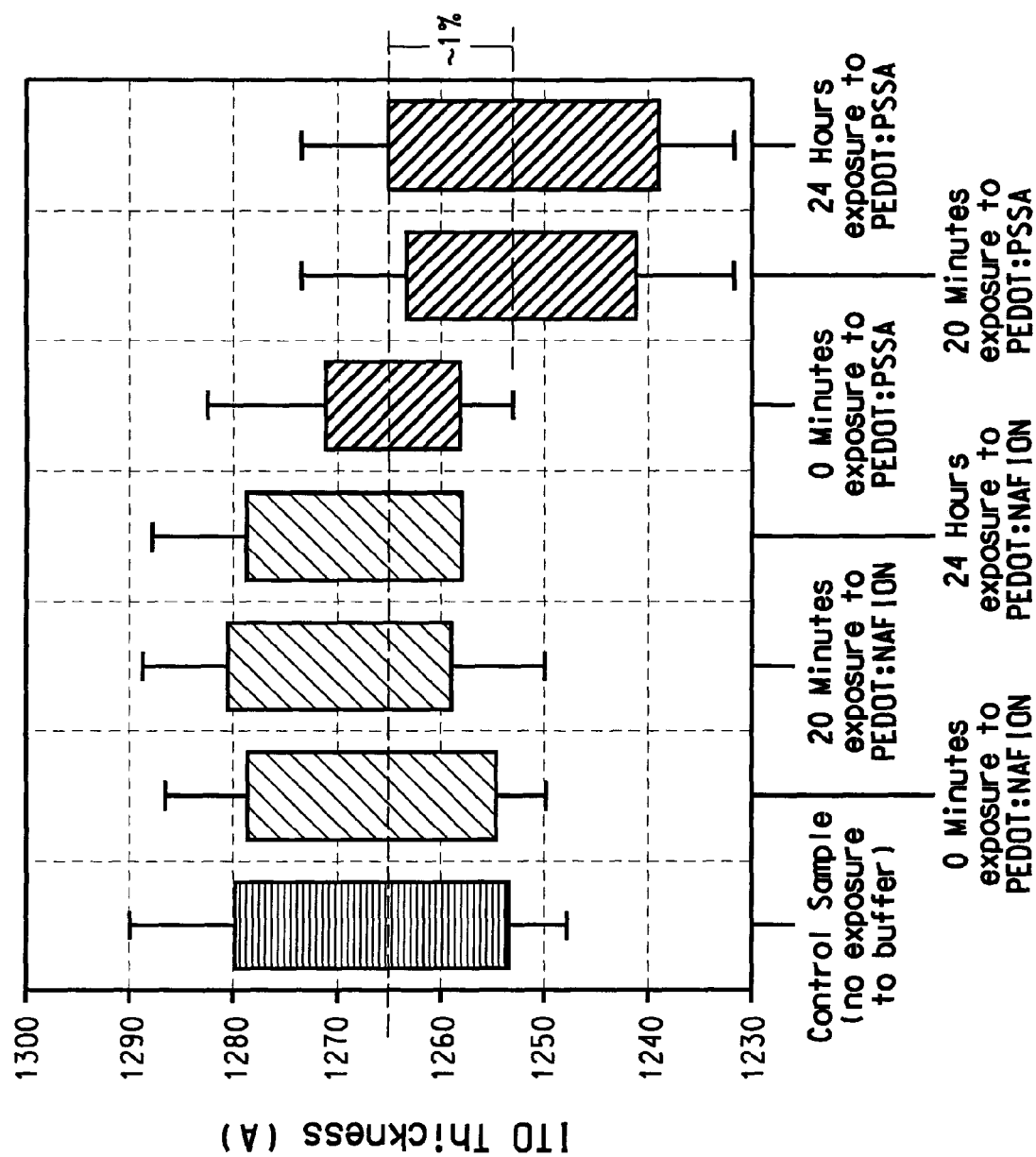
FIG. 10 illustrates the change in ITO thickness when immersed in dispersions of PEDT/Nafion® or PEDT/PSSA.

An ITO test substrate was prepared as follows: A glass substrate coated with ~1300 angstroms of ITO was obtained form Applied Films Inc. The ITO layer was etched into a stripe pattern with ITO stripes 300 microns wide. These stripes extended the full depth of the ITO layer, so that the substrate glass was exposed between the stripes. These stripes had well defined edges. A Tencor profilometer, with a vertical repeatability of ~10 angstroms was used to measure the height of the ITO stripes. Samples were immersed in CH8000 or PEDOT:NAFION at room temperature, for various times. Prior to measuring the ITO thickness the samples were rinsed in DI water and plasma ashed for 15 minutes to remove any organic residue. In each case ITO thickness was measured for 4 stripes on 2 separate substrates, giving a total of 8 data points for each measurement. The PEDT/Nafion® solution was prepared as described in Example 7 and had a pH of 3.8. The PEDT/PSSA solution was Baytron CH 8000, with a pH of about 1. The results are shown in FIG. 10. Note that after 24 hours of immersion in PEDT/PSSA the ITO thickness was reduced by ~1%. This was clearly visible in the optical interference color of the ITO film. In device manufacture, the exposure of ITO to liquid PEDT/PSSA typically lasts only a few seconds. However, the residual moisture in the PEDT/PSSA film will perpetuate the corrosion of the ITO throughout the lifetime of the device. The dissolution of 1% of the ITO layer will generate high concentrations of indium and tin ions in the PEDT/PSSA layer.

Example 23

This example illustrates compatibility of aqueous PEDT/Nafion® dispersion with PEDT/PSSA.

PEDT/PSSA (Baytron-P, grade Al4083) was selected for testing compatibility with aqueous PEDT/Nafion®, from Example 16. Aqueous blends from 95:5 PEDT/Nafion®:Al4083 all the way to 5:95 PEDT/Nafion®:Al4083 were made. All dispersion blends were found to be homogeneous and not phase separated. These blends are useful for the fabrication of OLEDs, and other electrically active devices.

Example 24

This Example illustrates the fabrication and performance enhancement of color OLED displays using common cathode metals and common buffer layer polymers for all colors.

OLED devices were fabricated as follows: 30 mm×30 mm glass substrates having a 15 mm×20 mm ITO area were cleaned with solvents and oxygen plasma. The ITO layer was 100-150 nm thick. The aqueous buffer (either PEDOT/Nafion®, prepared as in Example 16, or Baytron-P CH8000) dispersion was spin-coated, in air, onto the ITO/glass substrates and baked at 90° C. for 30 minutes in vacuum. The dried film thickness was in the range 50-100 nm. These substrates were then transferred into a nitrogen filled dry box with oxygen and water levels ~1 ppm. The light-emitting polymer, (Red: COVION AEF 2198, or Green: DOW K2, or Blue: COVION HS 670) was spin-coated on top of the buffer layer. The light-emitting polymer solution was ~1% solids in a common organic solvent such as toluene or xylene. The films were then baked a second time at 130° C. for 5 minutes in the dry-box. The thickness of the light-emitting layer was ~75 nm. These substrates were then transferred into a thermal evaporator and the cathode deposited under a vacuum of approx. $1 \times 10^{-6}$ torr. The cathode consisted of one of the following: (i) ~5 nm Ba followed by ~0.5 micron of Al, or (ii) ~5 nm Ca followed by ~0.5 micron of Al, or (iii) ~5 nm LiF followed by ~20 nm Ca followed by ~0.5 micron of Al. Finally these devices were removed from the dry-box and hermetically sealed prior to operational lifetime testing in an environmental chamber. The operating-lifetime testing conditions for these displays were: Initial luminance 200 cd/m2, DC constant current, testing temperature of 80° C. (in order to accelerate the testing process). The results are given in Table 4 below.

TABLE 4

| Polymer | Buffer layer | Cathode | Voltage (V) | Efficiency (cd/A) | Life time (hours) |
| --- | --- | --- | --- | --- | --- |
| Red (AEF2198) | CH8000 | Ba | 4.5 | 1.4 | 120 |
| | PEDOT/Nafion ® | Ba | 4.0 | 1.5 | 500 |
| Green (K2) | CH8000 | Ca | 3.4 | 3.2-6.8 | 400 |
| | PEDOT/Nafion ® | Ca | 3.0 | 4.0-6.0 | 700 |
| | PEDOT/Nafion ® | Ba | 2.8 | 6.0-10.0 | >2,000 |
| Blue (HS670) | CH8000 | Ba | 4.3 | 4.0-4.5 | 50 |
| | PEDOT/Nafion ® | LiF/Ca | 4.7 | 4.0-4.5 | 40 |
| | PEDOT/Nafion ® | Ba | 4.0-4.4 | 4.0-4.5 | 150 |

While the invention has been described in detail with reference to certain embodiments thereof, it will be understood that modifications and variations are within the spirit and scope of that which is described and claimed.

Example 25

This example illustrates preparation of a PEDOT/Nafion® dispersion in water with a co-dispersing liquid. The Nafion® was a 12% (w/w) aqueous colloidal dispersion with an EW of 1050, made using a procedure similar to the procedure in U.S. Pat. No. 6,150,426, Example 9.

95.41 g (10.89 mmoles of Nafion® monomer units) Nafion® (1050 EW) aqueous colloidal dispersion (12.0%, w/w), 185.12 g deionized water and 14.49 g 1-propanol (Aldrich cat# 49,619-7) were massed into a 500 ml jacketed three-necked round bottom flask. The mixture was stirred for 10 minutes before addition of 0.421 ml of Baytron-M dioxythiophene monomer. It was stirred for about 1 hour before addition of ferric sulfate and ammonium persulfate. A stock solution of ferric sulfate was made first by dissolving 0.0722 g ferric sulfate hydrate (97%, Aldrich cat. #30,771-8) with deionized water to a total weight of 21.44 g. 4.47 g (0.0452 mmoles) of the ferric sulfate stock solution and 1.65 g (7.23 mmoles) ammonium persulfate were then placed into the reaction flask while the mixture was being stirred. In the final polymerization liquid, the ratio between water and 1-propanol was 9 to 5. The polymerization was then allowed to proceed with stirring at about 20° C. controlled by circulation fluid. The polymerization liquid started to turn blue immediately. The reaction was terminated after 17 hours by adding 13.89 g Lewatit® S100 and 13.89 g Lewatit® MP62 WS. The two resins were washed first before use with deionized water separately until there was no color in the water. The resin treatment proceeded for 5 hrs. The resulting slurry was then suction-filtered through a Whatman #54 filter paper. It went through the filter paper readily. The solid % was about 4.5% (w/w) based on added polymerization ingredients.

The pH of the PEDOT/Nafion® dispersion was determined to be 5.3 with a 315 pH/Ion meter from Corning Company (Corning, N.Y., USA). The surface tension of was determined to be 41.9 milli Newton/meter at 20.6° C. with a FTA T10 Tensiometer Model 1000 IUD (KSV Instruments LTD, Finland). The surface tension was much lower than that (~73 mN/m) of aqueous PEDOT/Nafion* made without a co-dispersing liquid, as in Example 7. The dispersion was tested for filterability. 40 ml of the dispersion went through 0.45 μm HV filter (Millipore Millex-HV 25 mm, Cat. # SLHVR25KS) without changing a filter. It was also noticed that the viscosity was considerably lower than that of a same solid % made without a co-dispersing liquid judging from fluid flowing appearance.

What is claimed is:

1. A buffer composition comprising an aqueous dispersion of a polydioxythiophene and at least one colloid-forming polymeric acid wherein said colloid-forming polymeric acid is a fluorinated polymeric sulfonic acid wherein said polydioxythiophene has the following structure:

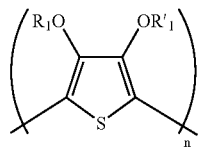

Wherein R1 and R1' form an alkylene chain having 1 to 4 carbon atoms, which is substituted by alkyl or aromatic groups having 1 to 12 carbon atoms, or R1 and R1' form a 1,2-cyclohexylene radical, and n is greater than about 6.

2. A buffer composition according to claim 1, wherein $R_1$ and $R_1'$ together form an alkylene chain having 1 to 4 carbon atoms.

3. A buffer composition according to claim 2, wherein said polydioxythiophene comprises poly(3,4-ethylenedioxythiophene).

4. A buffer composition according to claim 1, wherein said polymeric sulfonic acid is perfluorinated.

5. A buffer composition according to claim 1, wherein said polymeric sulfonic acid is a perfluoroalkylenesulfonic acid.

6. A buffer composition according to claim 5, wherein said polymeric sulfonic acid is perfluoroethylenesulfonic acid.

7. A buffer composition according to claim 1, wherein the composition has a pH greater than about 3.

8. A buffer composition according to claim 1, said composition further comprising an additional material selected from the group consisting of polymers, dyes, carbon nanotubes, metal nanowires, coating aids, organic and inorganic conductive inks and pastes, charge transport materials, crosslinking agents, and combinations thereof, wherein said colloid-forming polymeric acid is a fluorinated polymeric sulfonic acid.

* * * * *